(12) United States Patent
Lee et al.

(10) Patent No.: US 7,305,516 B2
(45) Date of Patent: Dec. 4, 2007

(54) MULTI-PORT MEMORY DEVICE WITH PRECHARGE CONTROL

(75) Inventors: Ihl-Ho Lee, Ichon-shi (KR); Kyung-Whan Kim, Ichon-shi (KR); Jae-Jin Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 446 days.

(21) Appl. No.: 10/877,887

(22) Filed: Jun. 25, 2004

(65) Prior Publication Data

US 2005/0259477 A1 Nov. 24, 2005

(30) Foreign Application Priority Data

May 10, 2004 (KR) ...................... 10-2004-0032650

(51) Int. Cl.
*G06F 12/00* (2006.01)
(52) U.S. Cl. .................. 711/105; 711/5; 365/230.05; 365/194; 365/230.03; 365/189.01
(58) Field of Classification Search .......... 365/230.05, 365/194, 230.03, 189.01
See application file for complete search history.

(56) References Cited

U.S. PATENT DOCUMENTS

| | | | | |
|---|---|---|---|---|
| 5,726,939 A | * | 3/1998 | Cho et al. ................... 365/201 |
| 5,726,969 A | * | 3/1998 | Moriya et al. ........... 369/275.1 |
| 5,777,918 A | * | 7/1998 | Chan et al. ................. 708/709 |
| 6,414,899 B2 | * | 7/2002 | Afghahi et al. ........ 365/230.06 |
| 6,617,879 B1 | * | 9/2003 | Chung ......................... 326/82 |
| 6,804,153 B2 | * | 10/2004 | Yoshizawa et al. .... 365/189.07 |
| 6,937,538 B2 | * | 8/2005 | Terzioglu et al. ...... 365/230.06 |

* cited by examiner

*Primary Examiner*—Reginald Bragdon
*Assistant Examiner*—Victor Wang
(74) *Attorney, Agent, or Firm*—Blakely, Sokoloff, Taylor & Zafman

(57) ABSTRACT

There is provided a multi-port memory device, which is capable of preventing a first high data fail phenomenon at an initial operation in a current sensing type global data bus transmission/reception structure without causing a problem in a low data transmission. In the multi-port memory device having a data transmission/reception block (bank, port, global data bus connection block, etc.) which exchanges data with the global data bus in a current sensing type data transmission/reception structure, an initialization switch is used to discharge each global data bus line and an initialization signal generator controls the initialization switch. A first high data fail at the initial operation is caused by a high precharge level of the global data bus. According to the present invention, it is possible to lower a high precharge level without causing a problem in data transmission.

11 Claims, 21 Drawing Sheets

MULTI-PORT MEMORY DEVICE WITH PRECHARGE CONTROL

FIELD OF THE INVENTION

The present invention relates to a semiconductor memory design technology; and, more particularly, to a technology for improving an initial voltage for a global data bus of a multi-port memory device.

DESCRIPTION OF RELATED ART

Most of memory devices, including a random access memory (RAM), have one port. Also, one port has a plurality of input/output pin sets. In other words, the memory device has only one port for data exchange with chipset. However, in recent years, a function separation between the memory device and the chipset has been ambiguous and an integration of the chipset and the memory device has been considered. This tendency demands a multi-port memory device that can directly exchange data with peripheral graphic devices, CUP, and so on. In order to implement such a multi-port memory device, any one of a plurality of ports must be able to provide an access to all memory cells.

FIG. 1 is a block diagram illustrating an architecture of a 256M multi-port DRAM, which is disclosed in Korean Patent Application No. 2003-92375, filed by the same applicant on Dec. 17, 2003.

Referring to FIG. 1, the 256M multi-port DRAM includes a plurality of memory cells and a plurality of row decoders RDEC. The 256M multi-port DRAM includes a plurality of banks bank0 to bank15, a control block 100, a plurality of ports port0 to port7, first to fourth global data buses GIO_UL, GIO_UR, GIO_DL and GIO_DR, first and second global data bus connection blocks, a plurality of transfer buses TB, a plurality of transfer bus connection blocks TG, a plurality of bus connection blocks TL, and a plurality of data transfer blocks QTRX.

The plurality of banks bank0 to bank15 are arranged in a row direction (a right and left direction in the drawing) as many as a predetermined number at four divided sections (quarters) of a core area.

The control block 100 is arranged between the first/third quarters and the second/fourth quarters to divide the core area into two sections. The control block 100 generates an internal command signal, an internal address signal and a control signal using an inputted command, addresses, and so on, and controls respective elements of the memory device.

The plurality of ports port0 to port7 are arranged at edge portions of the respective quarters and perform an independent communication with different target devices.

The first to fourth global data buses GIO_UL, GIO_UR, GIO_DL and GIO_DR are arranged between each bank and each port corresponding to the respective quarters in a row direction and perform a parallel data transmission.

The first and second global data bus connection blocks PR_U and PR_D are arranged between two global data buses, which are adjacent to each other in a row direction, and selectively connect the two global data buses.

The plurality of transfer buses TB are arranged in a column direction (an up and down direction in the drawing) of each bank and perform a data transmission inside the banks The plurality of transfer bus connection blocks TG arranged between two banks, which are adjacent to each other in a column direction, and selectively connect the two transfer buses TB.

The plurality of bus connection blocks TL are arranged between each bank and each global data bus of the quarter in which each bank is contained, and perform a data exchange between the corresponding transfer bus TB and the corresponding global data bus.

The plurality of data transfer blocks QTRX are arranged between each port and each global data bus of the quarter in which each port is contained, and perform a data transmission/reception between the corresponding port and the corresponding global data bus.

A detailed structure of the 256M multi-port DRAM will now be described.

Each of the sixteen banks bank0 to bank15 includes 16M DRAM cells (8k (row) 2k (column)) and the row decoder RDEC. Each bank includes a core circuit, such as a bit line sense amplifier and an equalizer, which is necessary in a typical DRAM core. The banks bank0 to bank15 are arranged at the four quarters, each of which includes four banks in a row direction. In detail, the banks bank0, bank2, bank4 and bank6 are arranged at the first quarter (a left and up section) of the core area, and the banks bank8, bank10, bank12 and bank14 are arranged at the second quarter (a right and up section). Also, the banks bank1, bank3, bank5 and bank7 are arranged at the third quarter (a left and down section), and the banks bank9, bank11, bank 13 and bank15 are arranged at the fourth quarter (a right and down section). Meanwhile, it is preferable that each row decoder RDEC is arranged to pair a row decoder RDEC of an adjacent bank at one side of each bank. One page (column) is divided into four segments, each of which consists of 512 cells.

The control block 100 generates internal command signals, internal address signals, and control signals using the command and addresses, which are transmitted in a packet form, and controls the respective elements of the memory device. Here, the internal command signals include an internal activation command signal (ACT), an internal inactivation command signal (PCG), an internal read command signal (RD), an internal write command signal (WD), and so on. The internal address signals include an activation array address (AAA), an inactivation array address (PAA), a read array address (RAA), a write array address (WAA), a row address (RA), a read segment address (RSA), a write segment address (WSA), and so on. The control signals include a transfer gate control signal (TGC), a pipe register flag signal (PRFG), a pipe register data driving signal (DP), a DRAM core test mode flag signal (DTM), and so on.

The ports port0 to port7 are arranged at die edge portions of the respective quarters, each of which includes two ports. The die edge portion means a major axis portion shared by all banks of the corresponding quarter. In detail, the ports port0 and port2 are arranged at the first quarter, and the ports port4 and port6 are arranged at the second quarter. The ports port1 and port3 are arranged at the third quarter, and the ports prot5 and port7 are arranged at the fourth quarter. Each port supports a serial I/O interface and performs an independent communication with different target devices (for example, chipset, graphic chip, etc.). Meanwhile, in case where the ports port0 to port7 are configured to support the serial I/O interface, each of the ports port0 to port7 includes a plurality of pads corresponding to data, addresses and commands, a pad buffer (a read buffer, a write buffer) for buffering transmission/reception signals transferred to the pad, a decoder for decoding the received data, an encoder for encoding the data to be transmitted, and a data converter for converting a received serial data into a parallel data and converting a parallel data to be transmitted into a serial data.

The first global data bus GIO_UL is arranged between the banks and the ports of the first quarter, and the second global data bus GIO_UR is arranged at the second quarter. The third global data bus GIO_DL is arranged at the third quarter, and the fourth global data bus GIO_DR is arranged at the fourth quarter. The first to fourth global data buses GIO_UL, GIO_UR, GIO_DL and GIO_DR are bi-directional data buses (512 bits), which are connected to the banks, ports and global data bus connection blocks PR_U and PR_D of the corresponding quarters, respectively.

Meanwhile, the first and second global data buses GIO_UL and GIO_UR can be connected to each other through the first global data bus connection block PR_U, and the third and fourth global data buses GIO_DL and GIO_DR can be connected to each other through the second global data bus connection block PR_D. The first and second global data bus connection blocks PR_U and PR_D include bi-directional pipe registers corresponding to the number (512) of the lines of the global data buses.

Also, the transfer buffers TB are local data buses for connecting the bit line sense amplifiers and the bus connection blocks TL of the corresponding banks. The number of the lines of the transfer buses TB is identical to the number (for example, 512) of the cells corresponding to one segment and the transfer buses TB are configured with differential buses.

The transfer bus connection blocks TG can be configured with MOS transistors, the number of which is identical to the number of the lines of the transfer buses TB. Because the transfer buses TB are the differential buses, one transfer bus connection block TG can be configured with 512 pairs of MOS transistors. For this reason, the transfer bus connection block TG is called a transfer gate.

Also, the bus connection block TL includes a total of sixteen sets, each of which is 512 transfer latches. Each of the transfer latches is provided with a read bus connection circuit (an I/O sense amplifier of DRAM) and a write bus connection circuit (a write driver of DRAM). Here, the read bus connection circuit includes a read sense amplifier for sensing and latching a read data, which is applied on the transfer bus TB, and a read driver for driving the latched data to the global data bus of the quarter to which the corresponding bank belongs. The write bus connection circuit includes a write latch for sensing and latching a write data, which is applied on the global data bus, and a write driver for driving the write data to the transfer bus TB.

The data transfer block TR includes 512 transmitters (Tx) for transmitting write data applied on a corresponding port to the global data bus, and 512 receivers (Rx) for receiving read data applied from the global data bus and transmitting the read data to a corresponding port.

Although not shown in the drawing, the 256M multi-port DRAM further includes a voltage generator, a test logic, and a variety of pads. The voltage generator is arranged at each edge portion of the die and is configured to receive an external voltage to generate an internal voltage. The test logic is arranged between the ports corresponding to the first and second quarters and between the ports corresponding to the third and fourth quarters. The pads include a clock pad arranged at the edge portion of the die.

Command lines (ACT, PCG, RD, WD) and address lines (AAA<0:1>, PAA<0:1>, RAA<0:1>, RA<0:12>, RSA<0:1>), which extend from the control block 100 to the corresponding banks, are provided at the respective quarters. Transfer gate control lines (TGC<0:3>) extending from the control block 100 to the transfer bus connection block TG are provided at the right and left sides of the control block 100.

FIG. 2 is a block diagram illustrating the segment and the transfer bus TB in the 256M multi-port DRAM of FIG. 1.

Referring to FIG. 2, like a general DRAM, the 256M multi-port DRAM includes a plurality of memory cell arrays 200 and a plurality of bit line sense amplifier arrays 210. In view of one memory cell array 200, a pair of transfer buses TB<0> and TBb<0> are connected to four bit line sense amplifiers BLSA that are arranged at upper and lower portions of the memory cell array 200 (refer to a box A). The four bit line sense amplifiers BLSA are controlled by different segment selection signals SGS<0:3>. The segment selection signal is a signal corresponding to a column selection signal (Yi) of the general DRAM. In case of 2k columns, if one row and one segment are selected, 512 cells are selected at the same time, such that data exchange with the corresponding 512-bit transfer buses TB<0:511> is achieved.

Meanwhile, the transfer buses TB corresponding to each bank of the first quarter can be connected through the transfer gates TG to the transfer buses TB corresponding to each bank of the third quarter, which is arranged on the same column axis (512 transfer gates TG are configured as one set and a total of 8 sets are provided). In other words, the transfer gates TG are arranged between the transfer buses TB corresponding to two banks (which is defined as an array) arranged on the same column axis and selectively connects two transfer buses TB. A control signal TGC for controlling the transfer gates TG is generated from the control block 100.

An operation of the 256M multi-port DRAM will now be described.

FIGS. 3A and 3B illustrate a normal read path and a normal write path of the 256M multi-port DRAM shown in FIG. 2, respectively.

First, an operation of reading out 512-bit data from a specific segment of the bank bank0 through the port port0 will be described.

Referring to FIG. 3A, if command and address related to a read operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal read command signal (RD), a read array address (RAA) and a read segment address (RSA) for the bank bank0. The bit line sense amplifier BLSA senses and amplifies 512-bit data of a segment corresponding to the read segment address (RSA), thus driving the transfer buses TB and TBb. Meanwhile, the bus connection block TL of the bank bank0 senses a read data applied on the transfer buses TB and TBb of the bank bank0 and drives data to the first global data bus GIO_UL. Then, the read data transferred to the first global data bus GIO_UL is stored in the read buffer of the port port0 through the receiver (Rx) of the data transfer block QTRX corresponding to the port port0. The data stored in the read buffer is converted into a packet of predetermined unit and transmitted to the target device connected to the port port0 in a serial data form. Then, the control block 100 generates an internal inactivation command signal (PCG) and an inactivation array address (PAA) to inactivate the row of the corresponding array. At this time, the transfer bus connection block TG of the corresponding array becomes a switched-off state, such that the transfer buses TB and TBb of the bank bank0 are disconnected from the transfer buses TB and TBb of the bank bank1 arranged within the same array. Reference numerals "BL" and "BLb" represent bit line pair, a reference numeral "T" represents a cell transistor, and a reference numeral "C" represents a cell capacitor.

Next, an operation of writing 512-bit data to a specific segment of the bank bank0 through the port port0 will be described.

Referring to FIG. 3B, if command, address and data related to a write operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal write command signal (WT), a write array address (WAA) and a write segment address (WSA) for the bank bank0. At this time, 512-bit data stored in a write buffer of the port port0 are written to a segment (512 memory cells) corresponding to the write segment address (WSA) by a scheduling. The data converted into the parallel data at the port port0 are loaded on the first global data bus GIO_UL through the transmitter (Tx) of the data transfer block TR and are driven to the transfer buses TB and TBb of the bank bank0 through the bus connection block TL of the bank bank0. The data loaded on the transfer buses TB and TBb of the bank bank0 are stored in 512 memory cells through the bit line sense amplifiers BLSA corresponding to the write segment address (WSA). Then, the control block 100 generates an internal inactivation command signal (PCG) and an inactivation array address (PAA) to inactivate the row of the corresponding array.

FIGS. 4A and 4B illustrate a cross read path and a cross write path of the 256M multi-port DRAM of FIG. 2, respectively.

First, an operation of reading out 512-bit data from a specific segment of the bank bank0 through the port port1 will be described.

Referring to FIG. 4A, an overall operation is almost similar to the above-described normal read operation. A difference is that the transfer bus connection block TG of the corresponding array is in a switched-on state such that the transfer buses TB and TBb of the bank bank0 are connected to the transfer buses TB and TBb of the bank bank1 within the same array.

Meanwhile, the data loaded on the transfer buses TB and TBb of the bank bank1 are transferred to the target device through the bus transfer block TL of the bank bank1, the third global data bus GIO_DL, the data transfer block TR of the port port1, and the port port1 in sequence.

Next, an operation of writing 512-bit data to a specific segment of the bank bank0 through the port port1 will be described.

Referring to FIG. 4B, an overall operation is almost similar to the above-described normal write operation. A difference is that the transfer bus connection block TG of the corresponding array is in a switched-on state such that the transfer buses TB and TBb of the bank bank0 are connected to the transfer buses TB and TBb of the bank bank1 within the same array. In this case, the data applied on the port port1 are loaded on the transfer buses TB and TBb of the bank bank0 through the bus transfer block TR of the port port1, the third global data bus GIO_DL, and the bus connection block TL of the bank bank1 in sequence. Following procedures are identical to the above-described normal write operation.

Meanwhile, in case where data exchange between the first global data bus GIO_UL and the second global data bus GIO_UR is required, the two global data buses are connected through the first global data bus connection block PR_U. In case where data exchange between the third data global data bus GIO_DL and the fourth global data bus GIO_DR is required, the two global data bus lines are connected through the second global data bus connection block PR_D.

Since the proposed 256M multi-port DRAM can access all segments at all ports port0 to port7 and also provide an independent access through a plurality of ports, a multi access is possible within a range in which the global data buses are not used overlappingly. Also, since the 256M multi-port DRAM can process 512-bit data in parallel at the respective quarters of the core area through an application of the new architecture and can input/output data in serial at the ports. Accordingly, an increase of a layout area is minimized, a packaging is simplified, and a bandwidth is greatly increased without causing a skew between data lines at the data buses.

FIG. 5 is a block diagram illustrating a data transmission structure of the 256M multi-port DRAM shown in FIG. 1.

Referring to FIG. 5, the multi-port DRAM includes a global data bus GIO which is disposed between an I/O interface and the memory cell block, that is, between the ports and the banks. Data can be exchanged through the global data bus GIO. Also, a data transfer block QTRX is provided for data transmission/reception between the global data bus GIO and the port, and a bus connection block TL is provided for data transmission/reception between the global data bus GIO and the bank.

FIG. 6 is a block diagram illustrating a structure of the global data bus GIO of the 256M multi-port DRAM shown in FIG. 1.

Referring to FIG. 6, an entire chip includes four quarters Quarter_lu, Quarter_ru, Quarter_ld and Quarter_rd, each of which can operate like an independent DRAM and is configured with the same structure. For example, in case of the first quarter Quarter_lu, four banks, two ports and the global data bus connection block PR_U are connected to the global data bus GIO. Like this, if one global data bus is shared with several units, there may occur problems in that a loading of the global data bus GIO is increased and data interference is caused.

FIG. 7 illustrates a worst read case and a worst write case of the 256M multi-port DRAM shown in FIG. 1.

Referring to FIG. 7, one global data bus GIO includes 512 bus lines in horizontal and vertical directions. In a general silicon process, the vertical interconnections are implemented with a first metal line and the horizontal interconnections are implemented with a second metal line. Such a hierarchical metal line structure is used for simplicity of the interconnection. Generally, the first metal line disposed below the second metal line has a larger resistance than the second metal line. However, as shown, the vertical interconnection (the first metal line) has a great difference depending on a length bus line. In this case, a loading value of each bus line is shown differently.

A difference in the loading value according to data transmission path may be shown together with a difference in the loading value of each bus line. For example, when a read or write operation is performed between the port port0 and the bank bank6, data transmission path is long. Therefore, a loading of the global data bus GIO is also great. However, it may be changed depending on a method of arranging the lines of the global data bus GIO. Data transmission between the port port0 and the bank bank6 is not always a worst case.

As described above, the proposed multi-port DRAM includes 512-bit wide global data bus GIO. It can be seen that the multi-port DRAM has a larger number of bus lines than an existing DRAM (DDR2) having 64 global data bus lines.

In case where the number of the global data bus lines is less than 64, power consumption does not matter even when data transmitted through the buses fully swings to a core voltage Vcc. However, in case where the number of the global data bus lines is more than 64, for example, 128, 256 or 512, a large amount of current is consumed during data transmission, thus causing a problem of power consumption.

In order to solve the problem of the power consumption at the wide global data buses, a global data bus transmission/reception structure is disclosed in Korean Patent Application No. 2003-94697, which is filed by the same applicant on Dec. 22, 2003. The proposed global data bus transmission/reception structure uses a current sensing method, instead of a voltage driving method.

FIG. 8 is a circuit diagram of a transmitter and a receiver, which are disclosed in Korean Patent Applicant No. 2003-94697.

Referring to FIG. 8, the transmitter TX of the bus connection block TL is connected between a ground voltage terminal Vss and a global data bus GIO and is provided with NMOS transistors having gates receiving data signal TX1 and data driving pulse DP1.

The receiver RX of the bus connection block TL includes: a PMOS transistor P1 having a source connected to a power supply terminal VDD, and a drain and a gate diode-connected; a PMOS transistor P2 having a source connected to the power supply terminal VDD and a drain connected to an output node thereof; an NMOS transistor N1 having a source connected to the drain of the PMOS transistor P1, a drain connected to the global data bus GIO, and a gate receiving a reference voltage VR; an NMOS transistor N2 having a source connected to the drain (the output node) of the PMOS transistor P2 and a gate receiving the reference voltage VR; and an NMOS transistor N9 having a source connected to the drain of the NMOS transistor N2, a drain connected to the ground voltage terminal Vss, and a gate receiving a data evaluation signal EVAL1.

Meanwhile, the transmitter QTX of the data transfer block QTRX is connected between the global data bus GIO and the ground voltage terminal Vss and is provided with NMOS transistors N7 and N8 having gates receiving data signal TX2 and data driving pulse DP2.

The receiver QRX of the data transfer block QTRX includes: a PMOS transistor P3 having a source connected to the power supply terminal VDD, and a drain and a gate diode-connected; a PMOS transistor P4 having a source connected to the power supply terminal VDD and a drain connected to an output node thereof; an NMOS transistor N3 having a source connected to the drain of the PMOS transistor P3, a drain connected to the global data bus GIO, and a gate receiving the reference voltage VR; an NMOS transistor N4 having a source connected to the drain (the output node) of the PMOS transistor P4 and a gate receiving the reference voltage VR; and an NMOS transistor N10 having a source connected to the drain of the NMOS transistor N4, a drain connected to the ground voltage terminal Vss, and a gate receiving a data evaluation signal EVAL2.

Meanwhile, the global data bus GIO is implemented with an actually long metal line, which can be equivalently modeled with a resistor R and a capacitor C.

A "read" operation (RD) means that data are transmitted between the transmitter TX of the bus connection block TL and the receiver QRX of the data transfer block QTRX through the global data bus GIO. A "write" operation (WT) means that data are transmitted between the transmitter QTX of the data transfer block QTRX and the receiver RX of the bus connection block TL through the global data bus GIO.

Such data transmission structure charges or discharges the global data bus GIO depending on states of the data TX1 and TX2 to be transmitted at the transmitters TX and QTX and senses the state of the global data bus GIO at the receivers RX and QRX.

FIG. 9A is a timing diagram in case of a normal data transmission of the circuit shown in FIG. 8.

An operation of the circuit shown in FIG. 8 will now be described with reference to FIG. 9A, taking an example of the read operation (RD), that is, the data transmission between the transmitter TX of the bus connection block TL and the receiver QRX of the data transfer block QTRX.

The data driving pulse DP1 is a signal that is activated to a logic high level in synchronization with a clock in the read operation, thereby allowing data outputted from the bank to be applied on the global data bus GIO. The data evaluation signal EVAL2 is a signal that is activated to a logic high level after a predetermined time elapses from a time point when the data driving pulse DP1 is activated to a logic high level, thereby evaluating data applied on the global data bus GIO. Here, the predetermined time is a margin that can charge/discharge the global data bus GIO.

First, if the data signal TX1 and the data driving pulse DP1 inputted to the transmitter TX of the bus connection block TL are respectively logic high levels, the NMOS transistors N5 and N6 are turned on so that the global data bus GIO is discharged. At this point, the voltage level at the node A2 of the receiver QRX of the data transfer block QTRX is dropped below VDD-Vtp (threshold voltage of the PMOS transistor). Thus, the PMOS transistors P3 and P4 are turned on, so that the output DATA2 of the receiver QRX of the data transfer block QTRX becomes a logic high level. In other words, it can be seen that the data of the logic high level are well transmitted through the global data bus GIO.

Next, if the data signal TX1 is a logic low level and the data driving pulse DP1 is a logic high level, the global data bus GIO maintains a charged state. Therefore, the node A2 of the receiver QRX of the data transfer block QTRX is not discharged, so that the PMOS transistor P4 does not sufficiently drive the output terminal to a logic high level. If the data evaluation signal EVAL2 becomes a logic high level in such a state, the NMOS transistor N10 is turned on to discharge the output terminal. Also, the output DATA2 of the receiver QRX of the data transfer block QTRX becomes a logic low level. In other words, it can be seen that the data of the logic high level are well transmitted through the global data bus GIO.

Referring to FIG. 9B, there are four sections in which the data driving pulse DP1 is in a logic high level. This means that the data transmissions are performed four times. In other words, it means that data of logic high level are transmitted two times and data of logic low level are transmitted two times.

In case where the data of the logic high level are transmitted, the output DATA2 is not dropped to a logic low level in a normal case, even if the data evaluation signal EVAL2 becomes a logic high level, since the PMOS transistor P4 has a larger size than the NMOS transistor N10. However, a fluctuation phenomenon occurs to some degree.

As shown in FIG. 9B, such a fluctuation phenomenon acts as a noise in an initial operation, such that a first high data may be incorrectly recognized.

A principle of the first high data fail is shown in FIG. 10.

Referring to FIG. 10, if a sufficient time (several s) is maintained without the read or write operation, the global data bus GIO is charged and its voltage level continues to rise. Then, if the voltage level reaches a predetermined level, the global data bus GIO is not charged any more but maintained at the voltage level. Hereinafter, such a precharge voltage level of the global data bus GIO will be referred to as a saturated GIO level.

Referring again to FIG. 8, the receivers RX and QRX of the bus connection block TL and the data transfer block QTRX include the NMOS transistors N1 and N2, N3 and N4 having the gates receiving the reference voltage VR. The NMOS transistors N1 to N4 are active loads, whose resistances are changed depending on the reference voltage VR. Also, the NMOS transistors N1 to N4 function to adjust an amount of current flowing through the global data bus GIO.

Accordingly, the saturated GIO level is determined by the reference voltage VR. In other words, charges that are charged on the global data bus GIO are provided to the receivers RX and QRX, and the charging and speed of the global data bus GIO are determined depending on the states of the NMOS transistors N1 and N3 having the gates receiving the reference voltage VR. When the global data bus GIO is discharged, the NMOS transistors N1 and N3 having the gates receiving the reference voltage VR are strongly turned on. Then, if the global data bus GIO is charged and rises up to a voltage level of more than VR-Vtn (threshold voltage of the NMOS transistor), the NMOS transistors N1 and N3 are turned off, such that charges are not provided to the global data bus GIO any more. Accordingly, if the reference voltage VR is increased, the saturated GIO level is also increased, and if the reference voltage VR is decreased, the saturated GIO level is also decreased.

In case of the read operation, such a saturated GIO level causes a difference in a determination of a first high data and a following high data when the global data bus GIO is discharged with respect to the data signal TX1 of the logic high level during a logic high level section of the data driving pulse DP1. In other words, in case of the first high data, a discharge start point of the global data bus GIO is the saturated GIO level. In case of the following high data, a discharge start point of the global data bus GIO is lower than the saturated GIO level, so that a discharge condition is more excellent than the first high data. It can be checked that levels of the global data bus GIO are different at a case of the first high data and a case of the second high data at a time point when the data evaluation signal EVAL2 is activated to a logic high level. In other words, in case of the first high data, the global data bus GIO is not sufficiently discharged. Therefore, there is a strong probability that the receiver QRX of the data transfer block QTRX may determine the data as a low data.

As the loading of the global data bus GIO is increased much more, such a first high data fail problem becomes more seriously. The reason is that a time taken to discharge the global data bus GIO increases in proportion to the loading of the global data bus GIO. In the structure of the global data bus used in the multi-port DRAM, one global data bus GIO is shared by a plurality of transmission/reception blocks (for example, four banks, two ports, one global data bus connection block PR). Thus, the loading of the global data bus GIO is easy according to the data transmission paths. Also, the loading of the global data bus GIO is changed sensitively to the method of designing the global data bus lines. For this reason, the first high data fail is a very serious problem.

Meanwhile, if the reference voltage VR is lowered, it takes much time to charge the global data bus GIO, such that the first high data fail is reduced. However, a problem is incurred when a low data is transmitted.

Accordingly, a method of adjusting the reference voltage VR in order to prevent the first high data fail is not proper. There is a demand for other schemes of adjusting the precharge level of the global data bus GIO.

SUMMARY OF THE INVENTION

It is, therefore, an object of the present invention to provide a multi-port memory device, which is capable of preventing a first high data fail phenomenon at an initial operation in a current sensing type global data bus transmission/reception structure without causing a problem in a low data transmission.

In an aspect of the present invention, there is provided a multi-port memory device, comprising: a global data bus having a plurality of bus lines; a plurality of data transmission/reception blocks, each of which includes a current sensing type transmitter/receiver for exchanging data with the global data bus, the data transmission/reception block including a plurality of banks and ports; a plurality of switching units for discharging each bus line of the global data bus in response to an initialization signal; and an initialization signal generator for generating the initialization signal.

Preferably, the initialization signal generator includes: a pulse generation unit for generating a bank active information pulse in response to a bank active information signal defining an active section of all bank, which exchanges data exchange with a corresponding global data bus; a section signal generation unit for receiving the bank active information pulse and generating a bank active ignore signal for ignoring an activation of the bank active information pulse for a predetermined time after the bank active information pulse is activated; and a logic combination unit for generating the initialization signal in response to a power-up signal, the bank active information pulse and the bank active ignore signal.

Preferably, the initialization signal generator includes: a pulse generation unit for generating a bank active information pulse in response to a bank active information signal defining an active section of all bank which exchanges data with a corresponding global data bus; a pulse processing unit for outputting an initial control signal and an oscillation enable signal for controlling an activation of the initialization signal during an initial operation in response to the bank active information pulse and a power-up signal; a period pulse generation unit for generating a period pulse, which is activated periodically, in response to the oscillation enable signal; and a logic combination unit for generating the initialization signal in response to the bank active information signal, the bank active information pulse, the power-up signal, the period pulse, and the initial control signal.

In the multi-port memory device having a data transmission/reception block (bank, port, global data bus connection block, etc.) which exchanges data with the global data bus in a current sensing type data transmission/reception structure, an initialization switch is used to discharge each global data bus line and an initialization signal generator controls the initialization switch. As described above, the first high data fail at the initial operation is caused by a high precharge level of the global data bus. According to the present invention, it is possible to lower a high precharge level without causing a problem in data transmission.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 11:
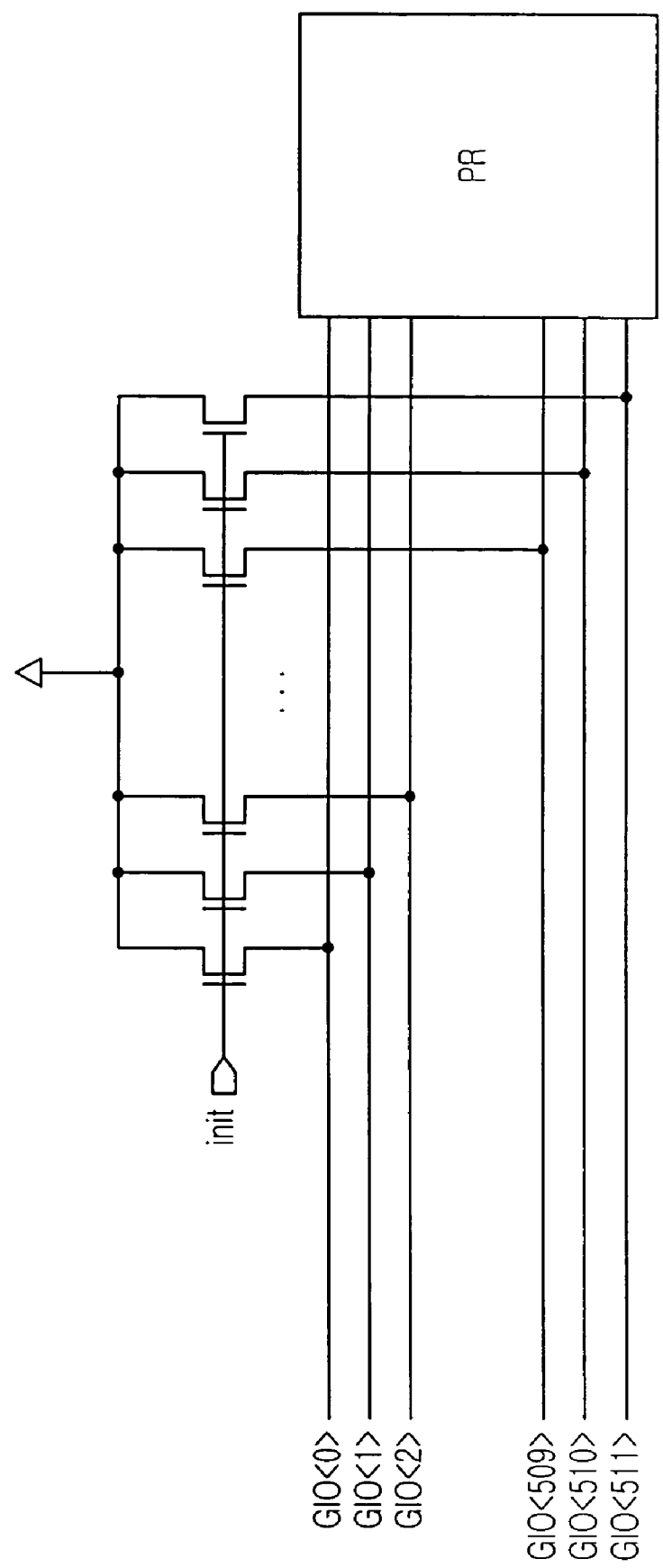
FIG. 11 illustrates an initialization structure of a global data bus in accordance with the present invention.

FIG. 11 illustrates an initialization structure of a global data bus GIO in accordance with the present invention.

Referring to FIG. 11, a multi-port memory device includes transistors for initializing 512-bit global data bus lines GIO<0:511>. Although NMOS transistors are exemplarily shown on the assumption that an initialization signal init is a high active signal, other kinds of transistors can be used.

All transistors are connected to a ground voltage terminal to discharge the respective global data bus lines GIO<0:511> when the initialization signal init is activated. The initialization signal init are commonly connected to one line and applied to all transistors.

Figure 1:
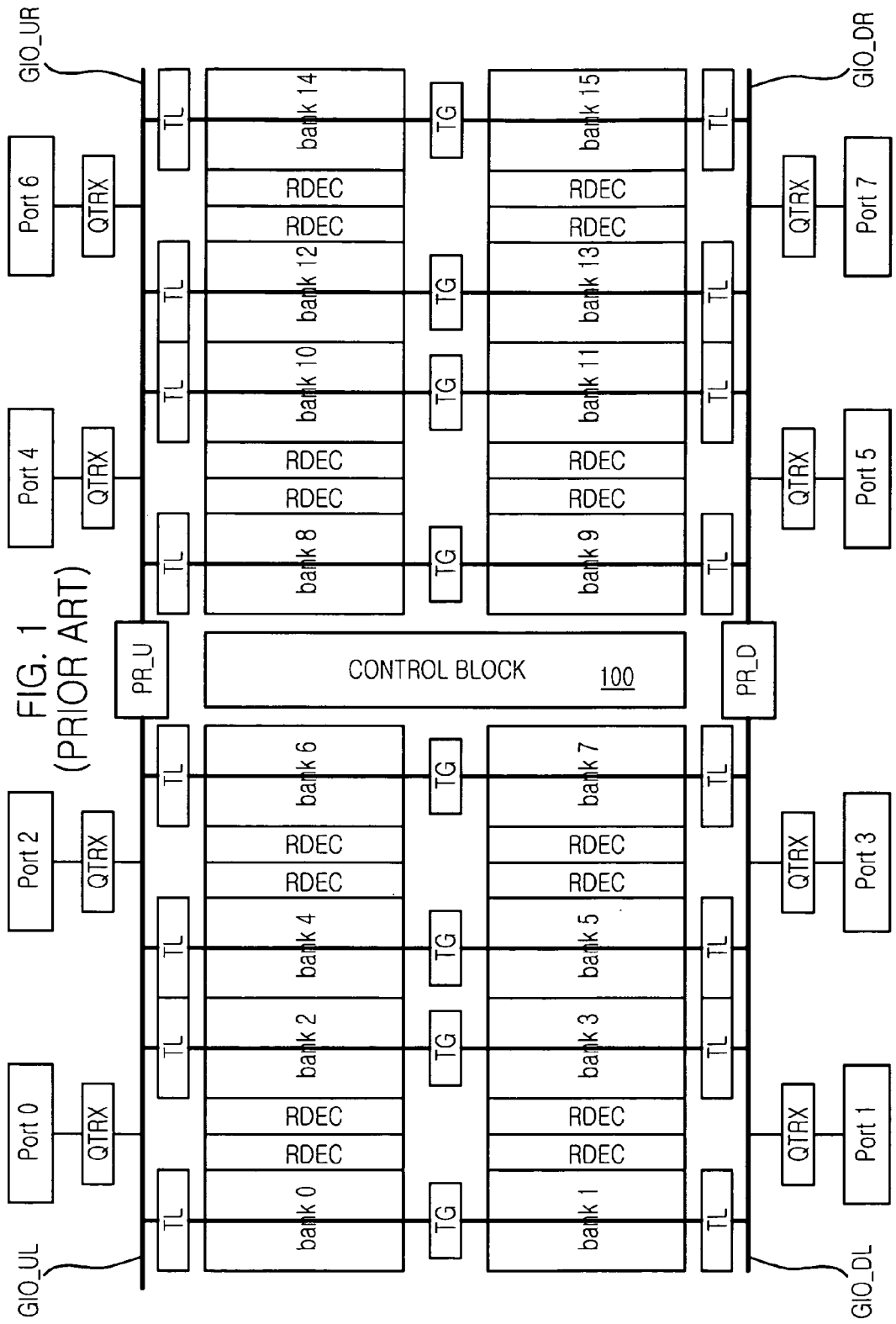
FIG. 1 illustrates an architecture of a 256M multi-port DRAM, which is disclosed in Korean Patent Application No. 2003-92375.
Figure 2:
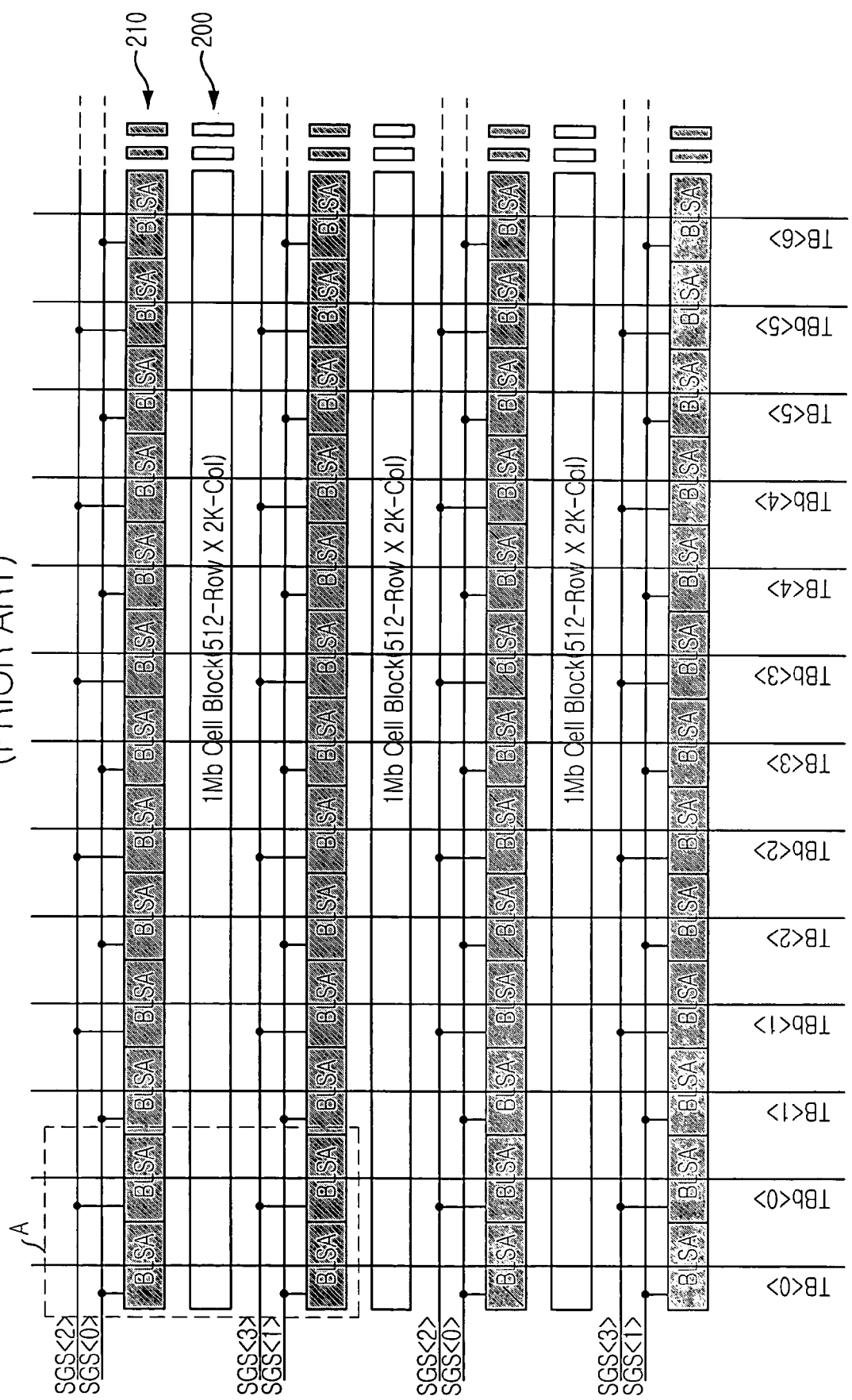
FIG. 2 is a block diagram illustrating a segment and a transfer bus TB in the 256M multi-port DRAM of FIG. 1.
Figure 3A:
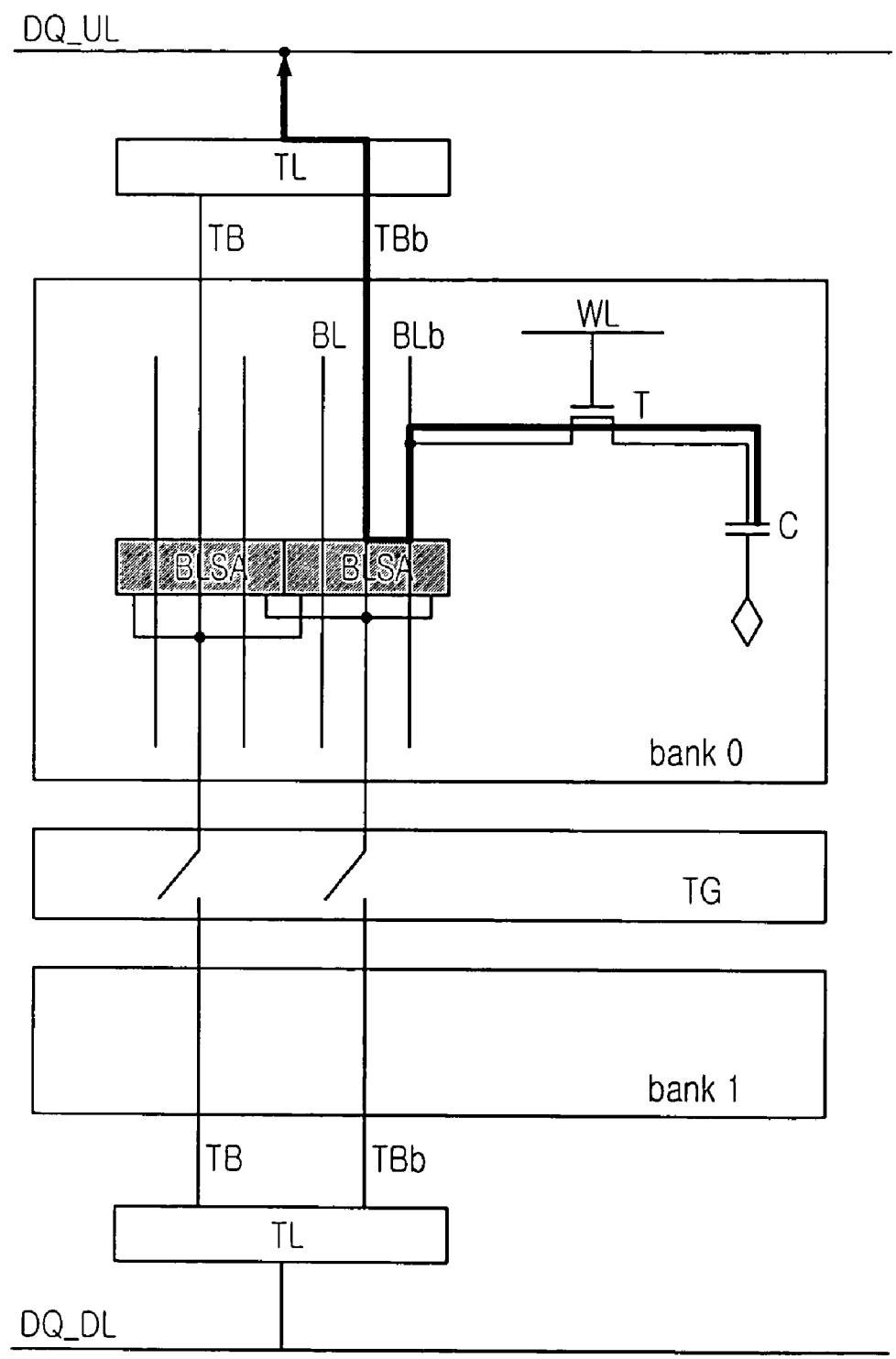
FIG. 3A illustrates a normal read path of the 256M multi-port DRAM depicted in FIG. 2.
Figure 3B:
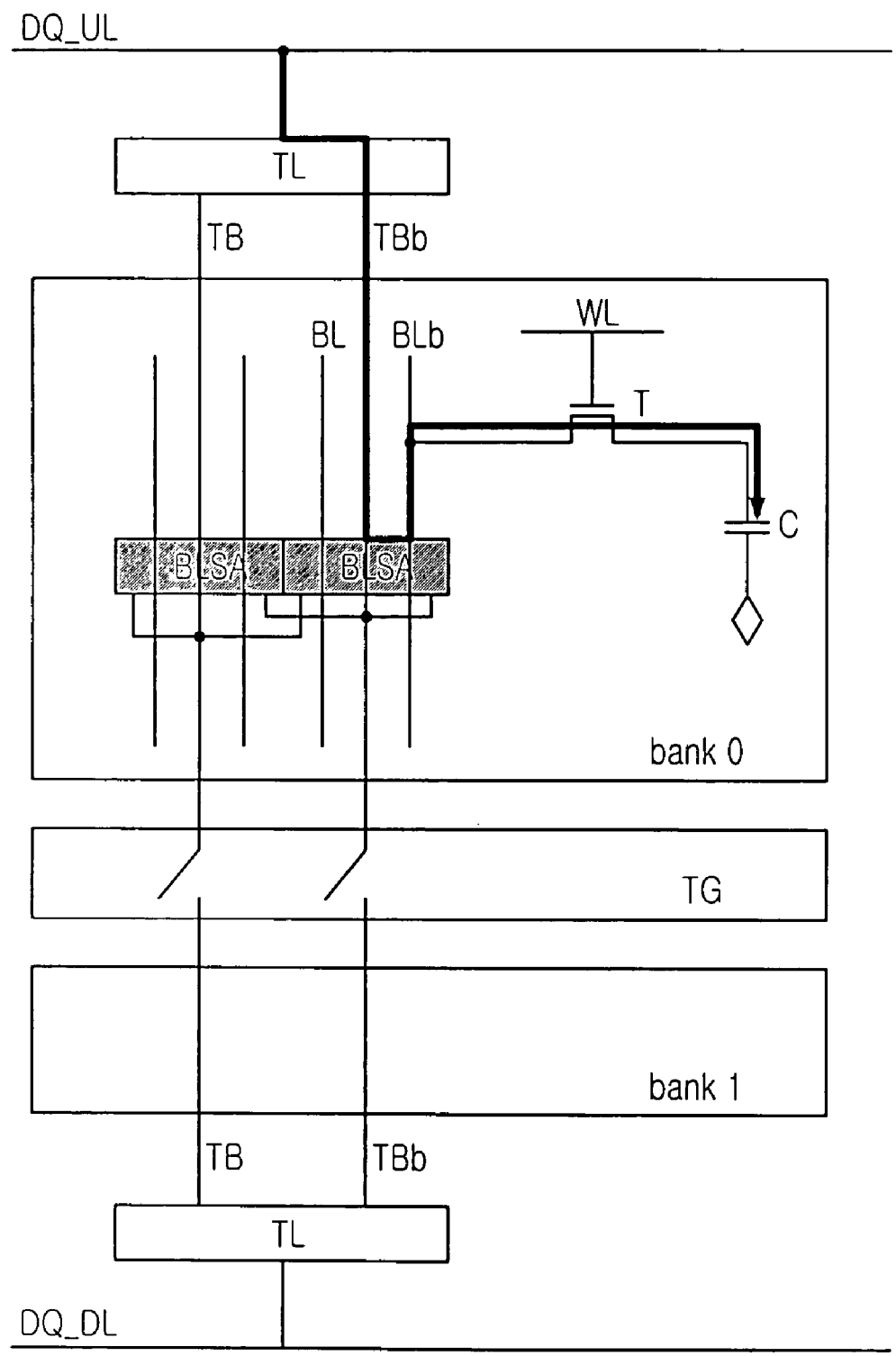
FIG. 3B illustrates a normal write path of the 256M multi-port DRAM depicted in FIG. 2.
Figure 4A:
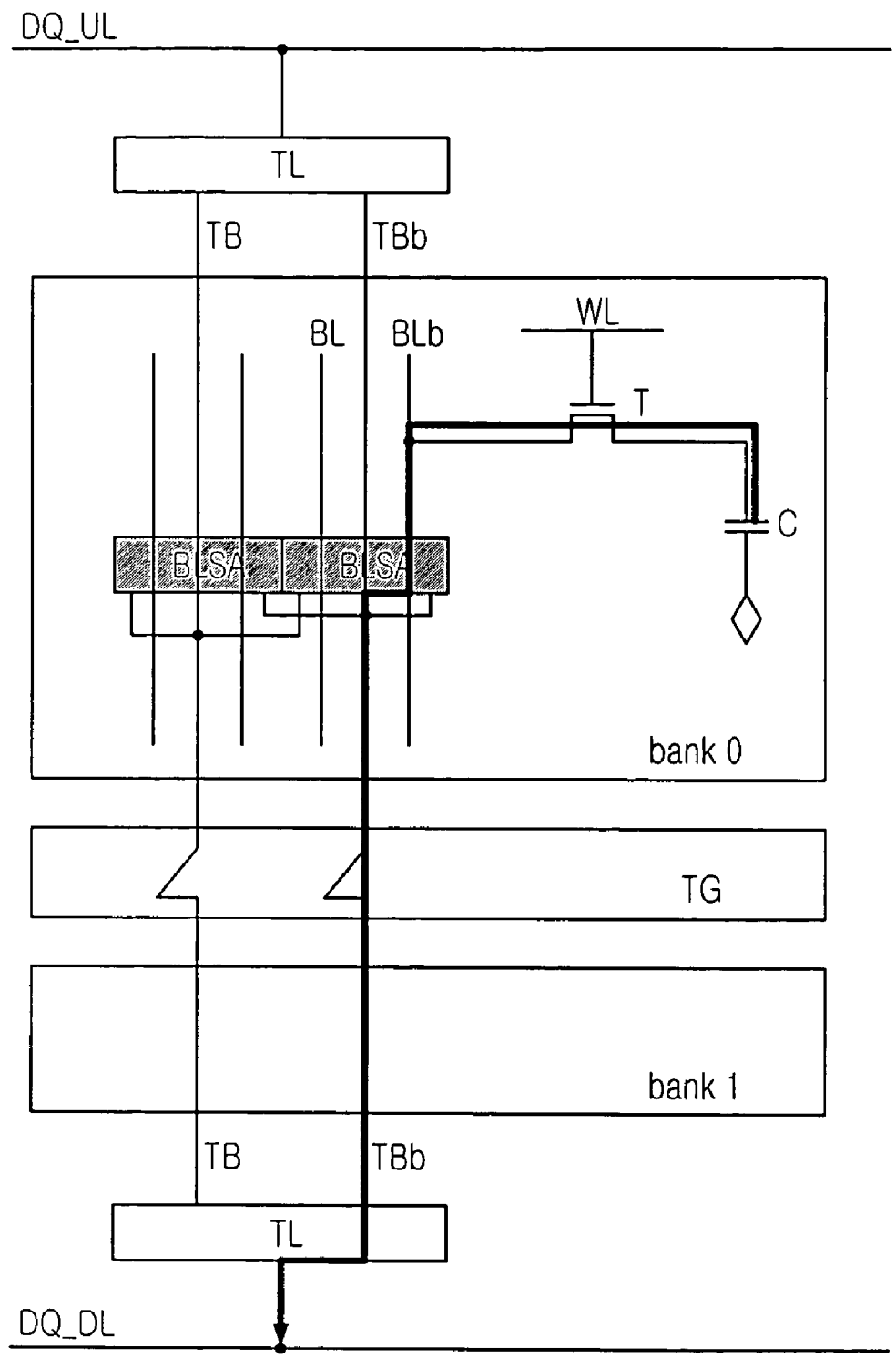
FIG. 4A illustrates a cross read path of the 256M multi-port DRAM depicted in FIG. 2.
Figure 4B:
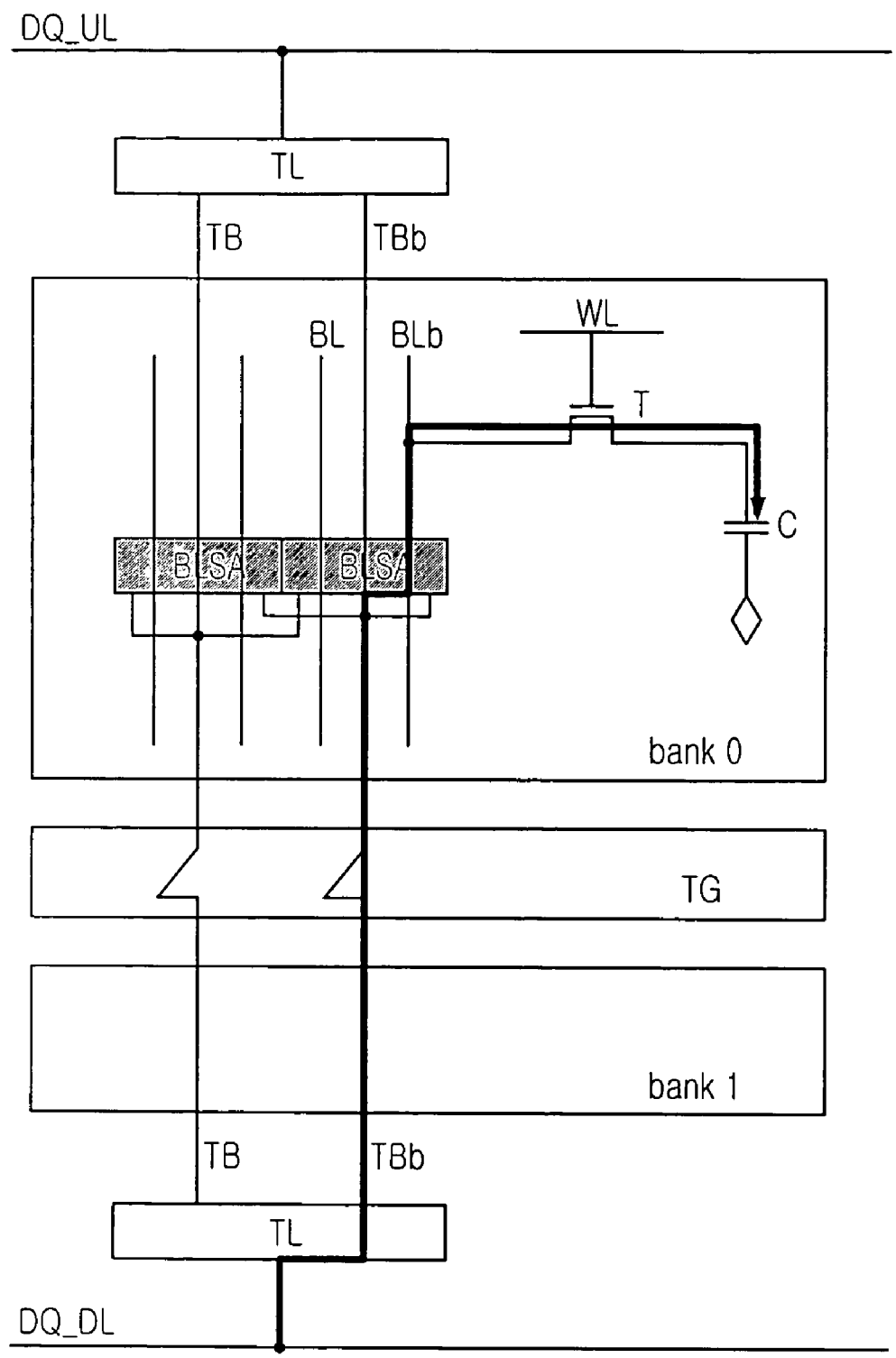
FIG. 4B illustrates a cross write path of the 256M multi-port DRAM depicted in FIG. 2.
Figure 5:
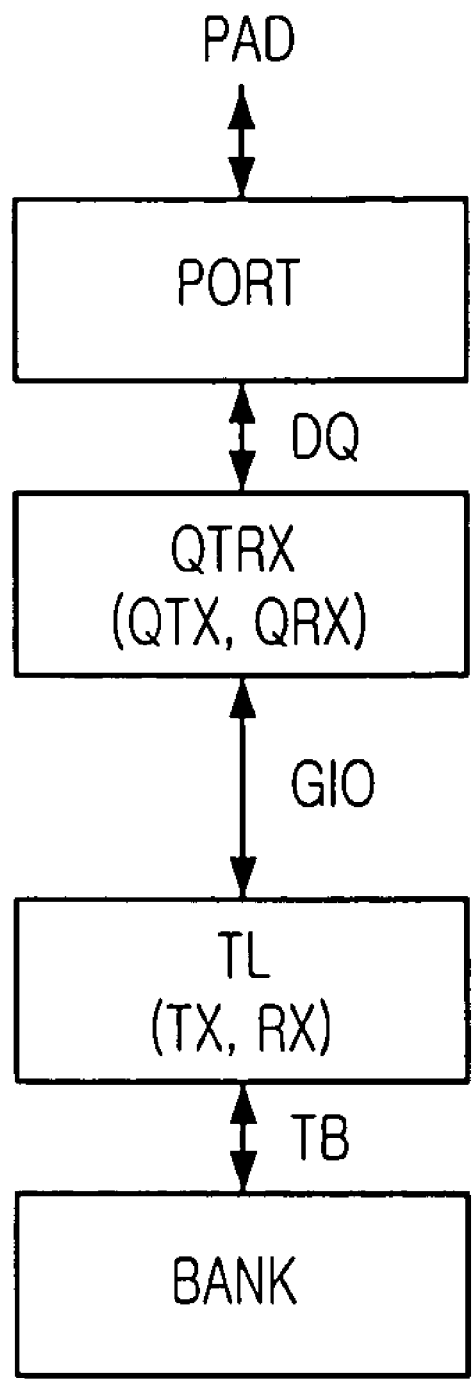
FIG. 5 is a block diagram illustrating a data transmission structure of the 256M multi-port DRAM shown in FIG. 1.
Figure 6:
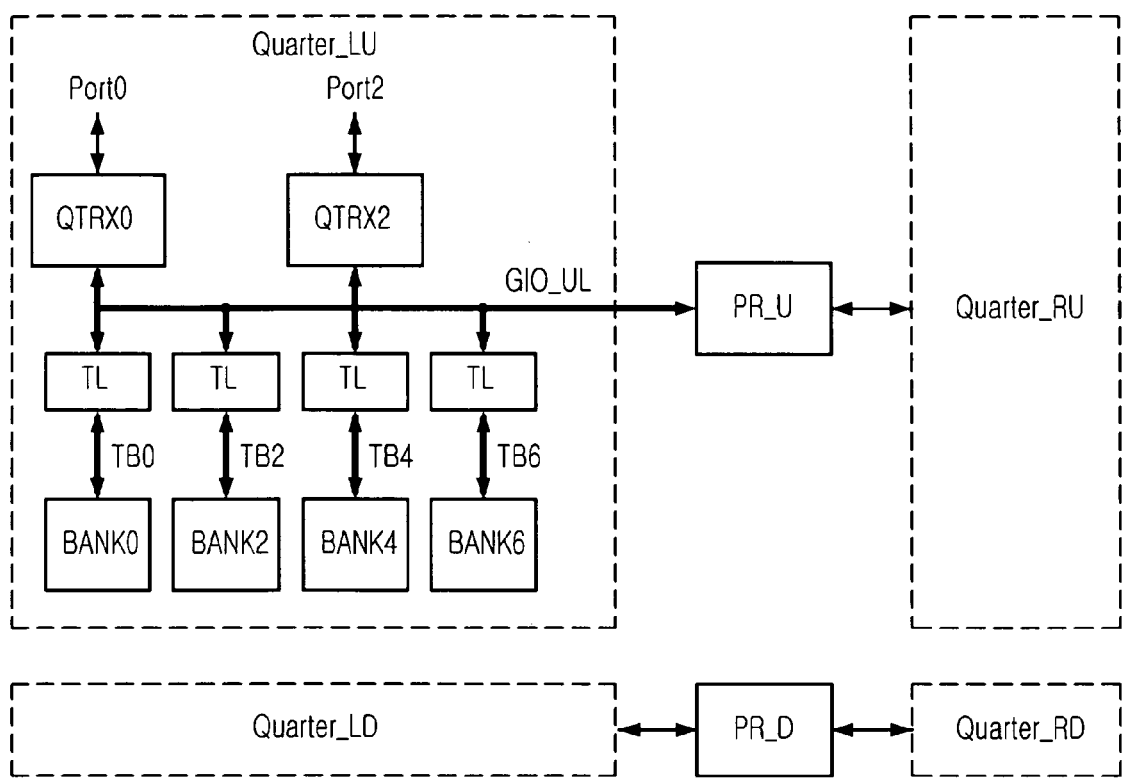
FIG. 6 is a block diagram illustrating a structure of a global data bus of the 256M multi-port DRAM shown in FIG. 1.
Figure 7:
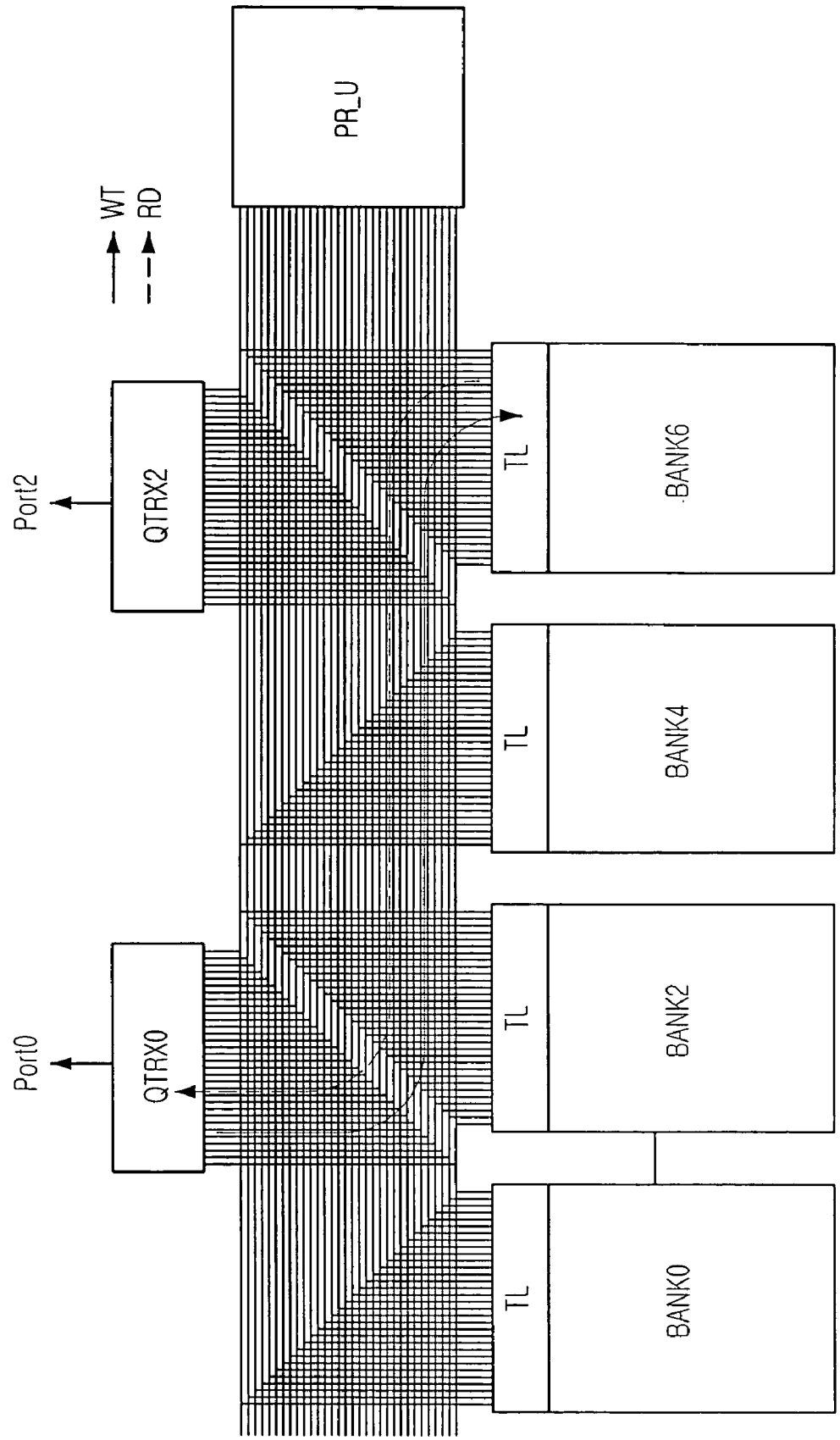
FIG. 7 illustrates a worst read case and a worst write case of the 256M multi-port DRAM shown in FIG. 1.
Figure 8:
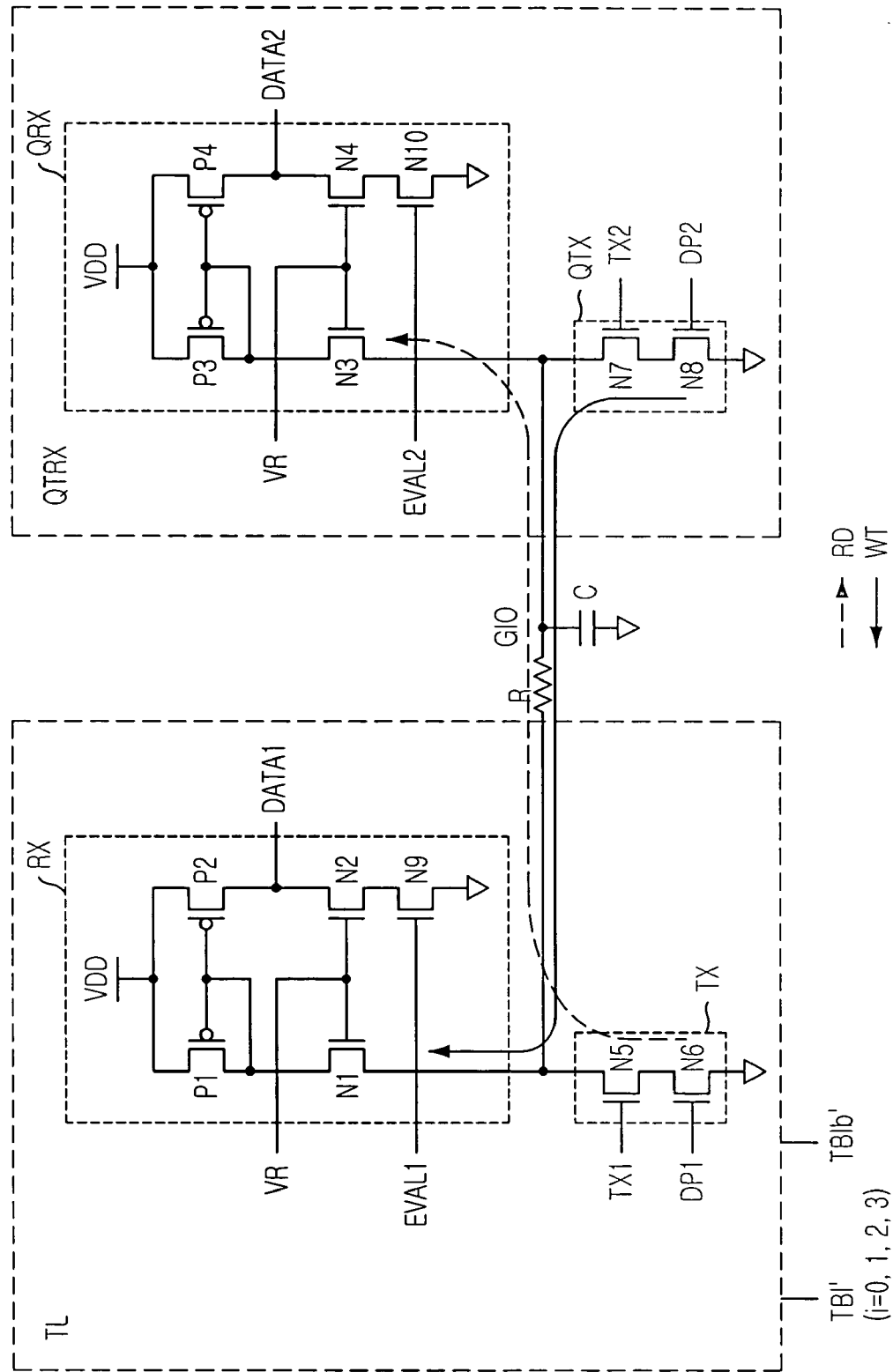
FIG. 8 is a circuit diagram of a transmitter and a receiver, which are disclosed in Korean Patent Applicant No. 2003-94697.
Figure 9A:
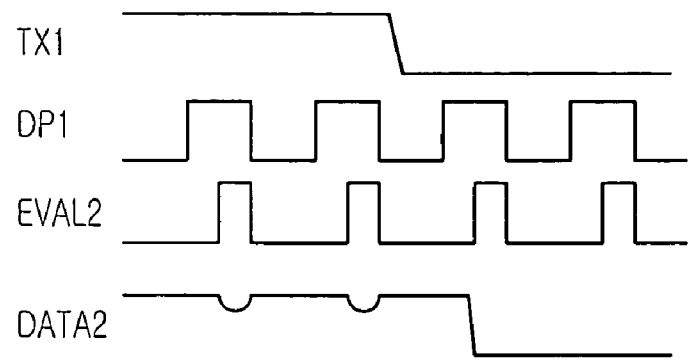
FIG. 9A is a timing diagram in case of a normal data transmission of the circuit shown in FIG. 8.
Figure 9B:
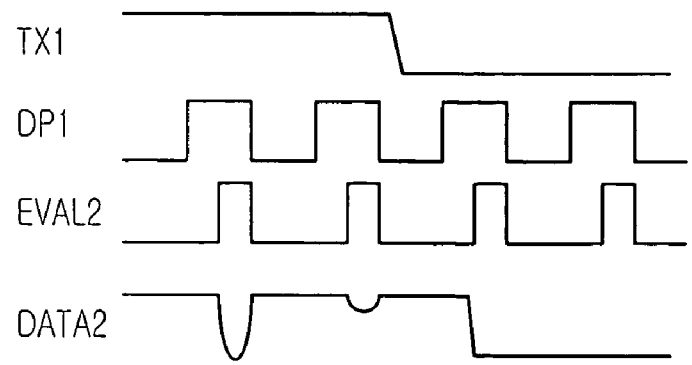
FIG. 9B is a timing diagram in case of an abnormal data transmission of the circuit shown in FIG. 8.
Figure 10:
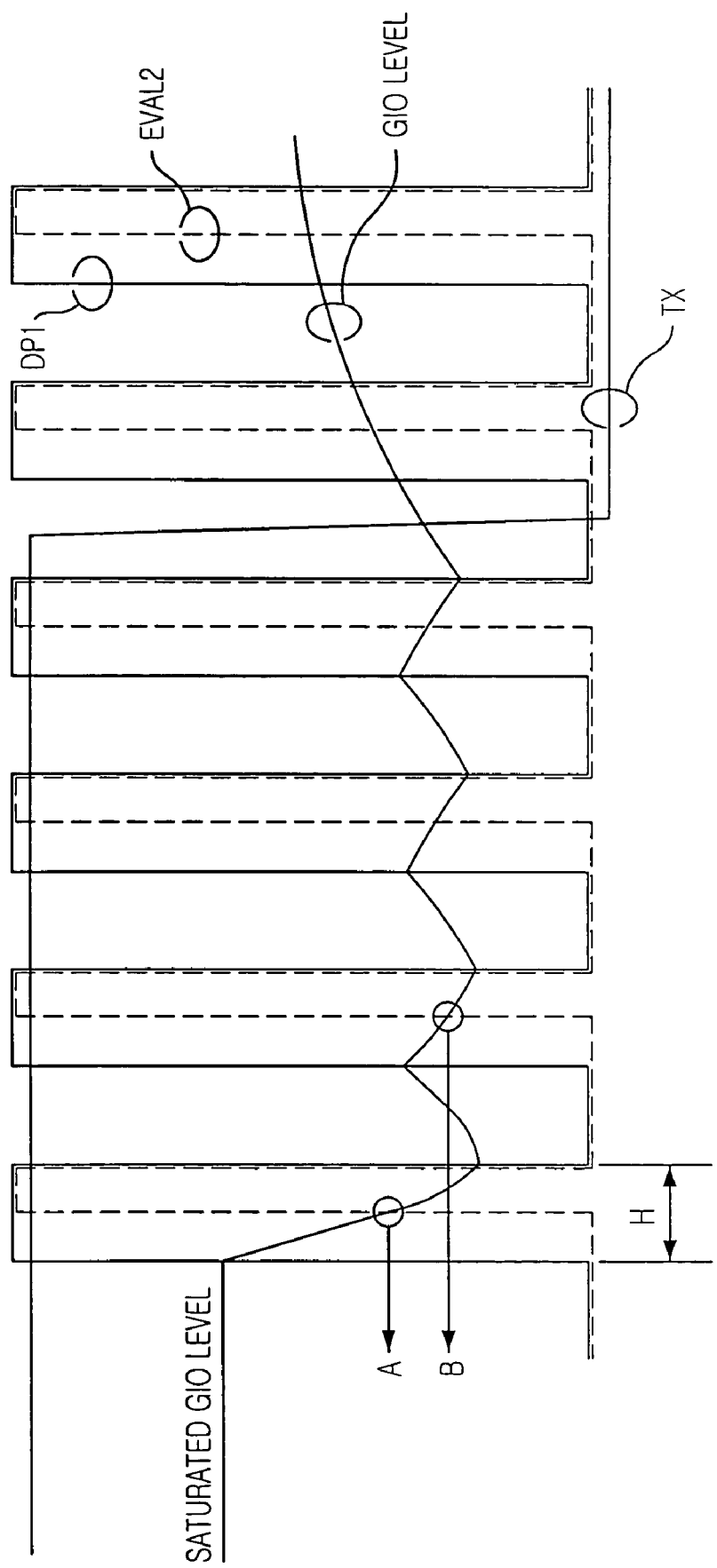
FIG. 10 is a simulation waveform of signal levels of the circuit shown in FIG. 8.

Although there is exemplarily shown in FIG. 11 that only a global data bus connection block PR is connected to the global data buses GIO<0:511>, a plurality of banks and ports are connected to the global data buses GIO<0:511>, as shown in FIG. 1.

Hereinafter, an embodiment of an initialization signal generator for controlling the transistors will be described in detail.

Figure 12:
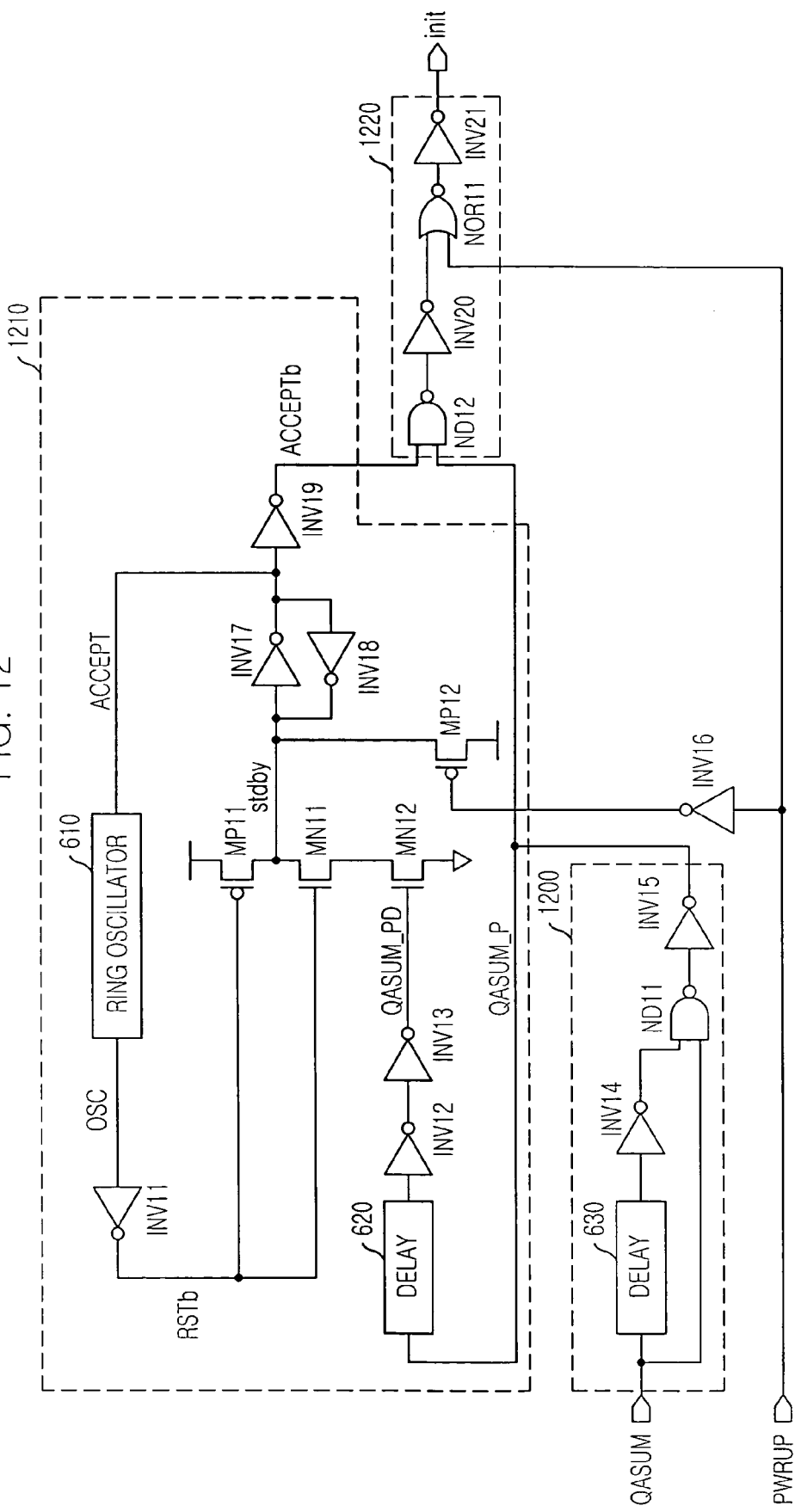
FIG. 12 is a circuit diagram of an initialization signal generator in accordance with an embodiment of the present invention.

FIG. 12 is a circuit diagram of an initialization signal generator in accordance with an embodiment of the present invention.

Referring to FIG. 12, an initialization signal generator of the present invention includes: a pulse generation unit 1200 for generating a bank active information pulse QASUM_P in response to a bank active information signal QASUM defining an active section of all bank which can exchange data with the corresponding global data bus; a section signal generation unit 1210 for receiving the bank active information pulse QASUM_P and generating a bank active ignore signal ACCEPTb for ignoring an activation of the bank active information pulse QASUM_P for a predetermined time after the bank active information pulse QASUM_P is activated; and a logic combination unit 1220 for generating the initialization signal init in response to a power-up signal PWRUP, the bank active information pulse QASUM_P and the bank active ignore signal ACCEPTb.

The pulse generation unit 1200 includes: a delay circuit 630 configured to receive the bank active information signal QASUM; an inverter INV14 configured to receive an output of the delay circuit 630; a NAND gate ND11 configured to receive an output of the inverter INV14 and the bank active information signal QASUM; and an inverter INV15 configured to receive an output of the NAND gate ND11 and generate the bank active information pulse QASUM_P.

The section signal generation unit 1210 includes: a delay circuit 620 configured to receive the bank active information pulse QASUM_P; an inverter INV12 configured to receive an output of the delay circuit 620; an inverter INV13 configured to receive an output of the inverter INV12 and output a delayed bank active information pulse QASUM_PD; a buffer configured with a pull-down NMOS transistor MN12 having a gate receiving the delayed bank active information pulse QASUM_PD, a pull-down NMOS transistor MN11 and a pull-up PMOS transistor MP11, each of which has a gate receiving a period end pulse RSTb; a PMOS transistor MP12 for initializing an output terminal of the buffer, the PMOS transistor MP12 being connected between the output terminal of the buffer and a power supply voltage terminal VDD and having a gate receiving an inverted power-up signal PWRUP outputted from an inverter INV16; an inverter latch configured with two inverters INV17 and INV18 for latching an output stdby of the buffer; an inverter INV19 configured to receive an output ACCEPT of the inverter latch and output the bank active ignore signal ACCEPTb; a ring oscillator 610 configured to receive the output ACCEPT of the inverter latch; and an inverter INV11 configured to receive an output OSC of the ring oscillator 610 and generate the period end pulse RSTb.

The logic combination unit 1220 includes: a NAND gate ND12 configured to receive the bank active information pulse QASUM_P and the bank active ignore signal ACCEPTb; an inverter INV20 configured to receive an output of the NAND gate ND12; a NOR gate NOR11 configured to receive the power-up signal PWRUP and an output of the inverter INV20; and an inverter INV21 configured to receive an output of the NOR gate NOR11 and output the initialization signal init.

Figure 13:
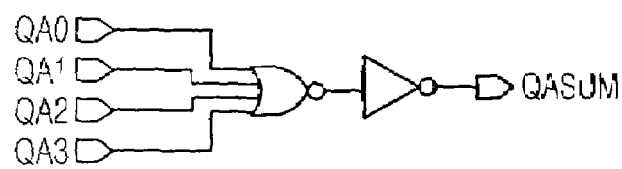
FIG. 13 is a circuit diagram of a bank active information signal generator shown in FIG. 12.

FIG. 13 is a circuit diagram of a bank active information signal generator for generating the bank active information signal QASUM in FIG. 12.

Referring to FIG. 13, the bank active information signal generator includes: a NOR gate configured to receive quarter bank active information signals QA0, QA1, QA2 and QA3; and an inverter configured to receive an output of the NOR gate and output the bank active information signal QASUM. In other words, the bank active information signal QASUM is generated by performing an AND operation of the quarter bank active information signals QA0, QA1, QA2 and QA3.

Here, the quarter bank active information signals QA0, QA1, QA2 and QA3 are signals that are activated until all banks of the corresponding quarters are precharged if any one of the banks belonging to the first to fourth quarters of the multi-port memory device shown in FIG. 1 is activated. As described above, the multi-port memory device can access all banks at all ports. Therefore, in addition to active information of the banks directly connected to the corresponding global data bus, active information of other banks must be considered.

Of course, since the multi-port memory device does not necessarily have the architecture of FIG. 1, information of all banks that can communicate with the corresponding global data bus has only to be collected.

Figure 14:
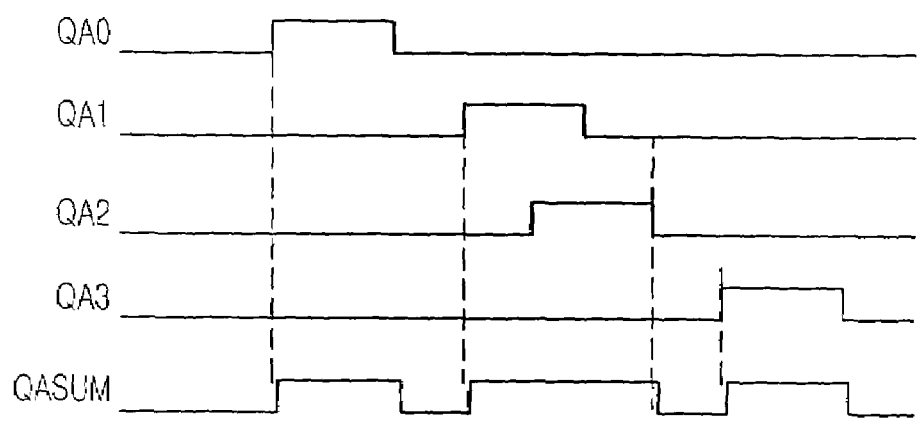
FIG. 14 is a timing diagram of the bank active information signal generator shown in FIG. 13.

FIG. 14 is a timing diagram of the bank active information signal generator shown in FIG. 13.

Referring to FIG. 14, the bank active information signal generator performs a logical AND operation of the quarter bank active information signals QA0, QA1, QA2 and QA3 and generates the bank active information signal QASUM. Accordingly, the bank active information signal QASUM maintains an activated state of a logic level in a section in which any one of the banks at any quarter is in an active state. The reason is that the corresponding global data bus may be used only at this section.

Figure 15:
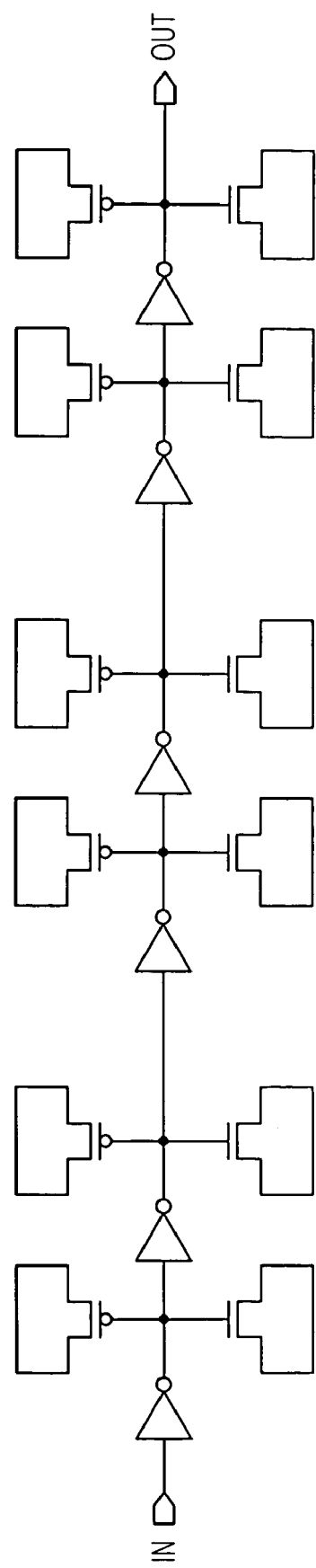
FIG. 15 is a circuit diagram of the delay circuit shown in FIG. 12.
Figure 16:
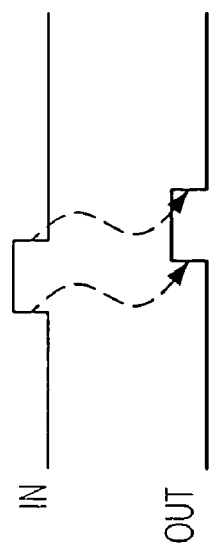
FIG. 16 is a timing diagram of the delay circuit shown in FIG. 12.

FIG. 15 is a circuit diagram of the delay circuit 620 (630) shown in FIG. 12, and FIG. 16 is a timing diagram of the delay circuit shown in FIG. 12.

Referring to FIG. 15, the delay circuit 620 (630) may be implemented with a plurality of inverters and a plurality of capacitors.

Referring to FIG. 16, the delay circuit generates an output OUT a phase of which is delayed from an input signal IN by a delay time, while maintaining a pulse width of the input signal IN.

The delay circuit 630 has a delay time corresponding to a pulse width of the bank active information pulse QASUM_P. The delay circuit 620 must be designed to have a greater delay time than a time taken to output the bank active information pulse QASUM_P as the initialization signal init through the logic combination unit 1220.

Figure 18:
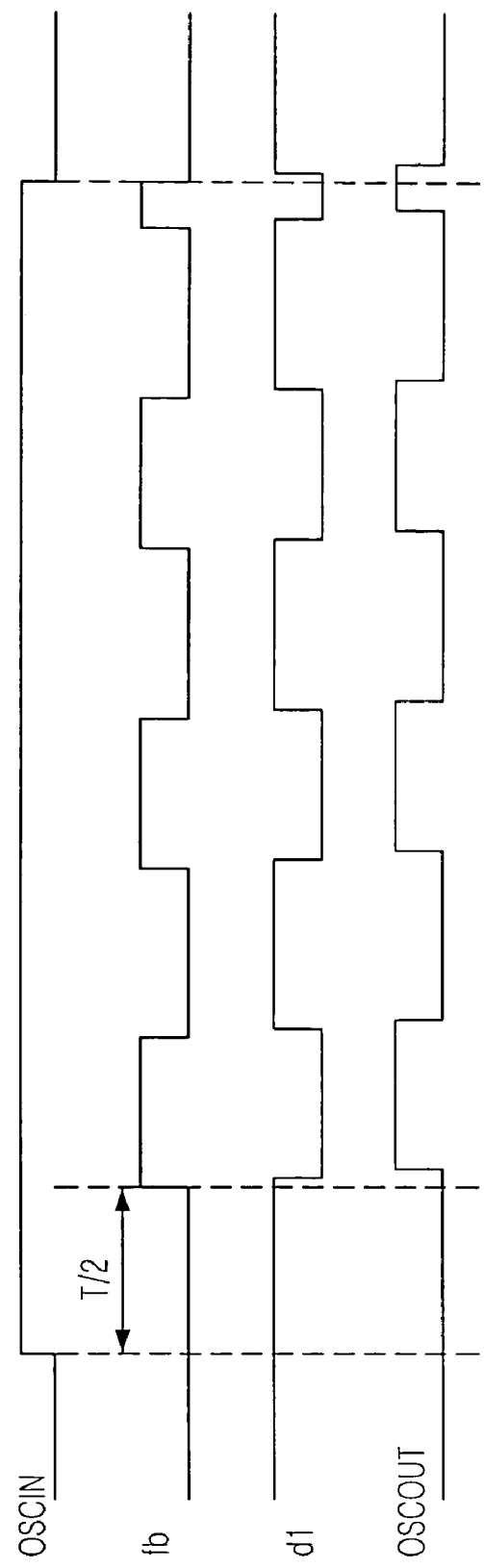
FIG. 18 is a timing diagram of the ring oscillator shown in FIG. 17.
Figure 17:
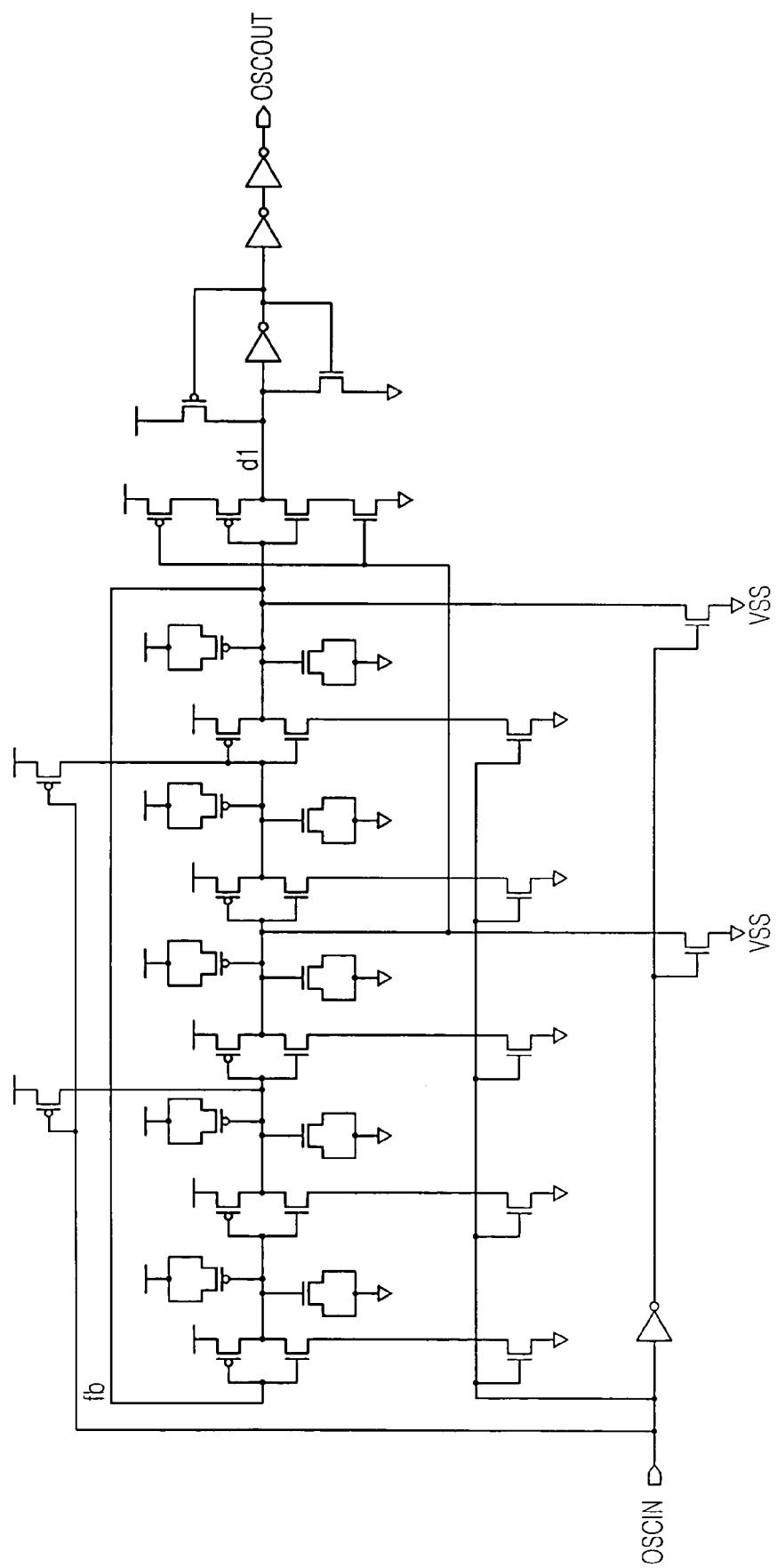
FIG. 17 is a circuit diagram of the ring oscillator shown in FIG. 12.

FIG. 17 is a circuit diagram of the ring oscillator 610 shown in FIG. 12, and FIG. 18 is a timing diagram of the ring oscillator shown in FIG. 17.

Since the ring oscillator 610 of FIG. 17 has the same structure as a general ring oscillator, its detailed description will be omitted.

An operation of the ring oscillator 610 will be described in brief with reference to FIG. 18. First, an initial value of an input signal OSCIN is a logic low level. Thus, an output signal OSCOUT is first set to a logic low level and then is oscillated with half period of R-C capacitor delay until it is again changed to a logic low level after the input signal OSCIN is changed to a logic high level.

Figure 19:
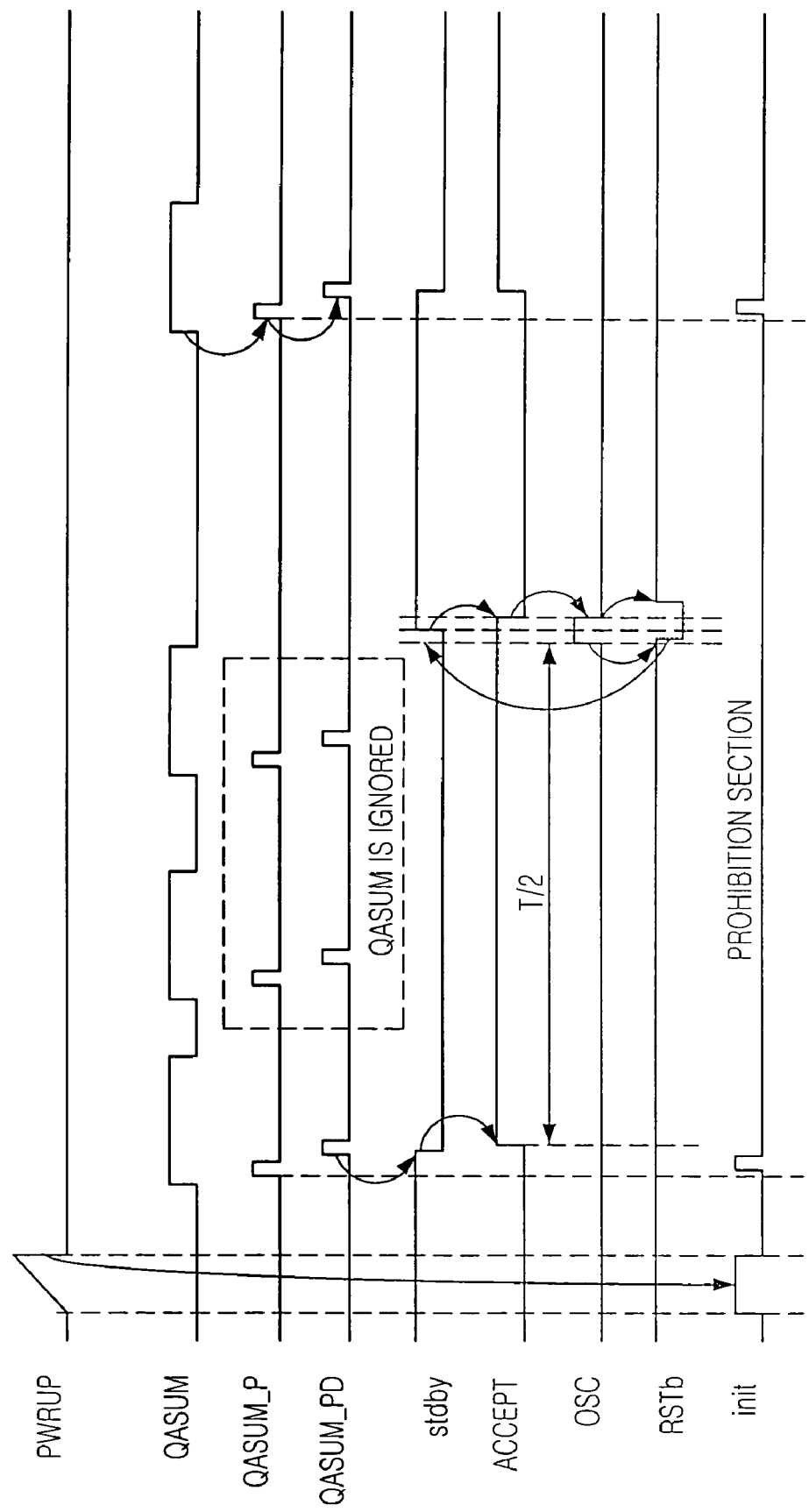
FIG. 19 is a timing diagram of the initialization signal generator shown in FIG. 12.

FIG. 19 is a timing diagram of the initialization signal generator shown in FIG. 12. An operation of the initialization generator will be described with reference to FIG. 19.

If an external power is applied to a chip and thus the power-up signal PWRUP is set to a logic high level, a logic high level is applied to the NOR gate NOR11 of the logic combination unit 1220, such that the initialization signal init is activated to a logic high level. Meanwhile, the PMOS transistor MP12 of the section signal generation unit 1210 is turned on. Therefore, the output terminal of the buffer is initialized to a logic high level and the bank active ignore signal ACCEPTb maintains a logic high state until the latched value is changed.

Then, if the power-up signal PWRUP becomes a logic low level, the initialization signal init is also inactivated to a logic low level.

Next, if the bank active information signal QASUM is first activated to a logic high level, the pulse generation unit 1200 receives a rising edge of the bank active information signal QASUM and allows the back active information pulse QASUM_P to pulse to a logic high level. The logic combination unit 1220 receives the bank active information pulse QASUM_P and activates the initialization signal init to a logic high level. In this manner, a time point when a pulsing of the first bank active information pulse QASUM_P is outputted as the initialization signal init leads a time point when the delayed bank active information pulse QASUM_PD is pulsed, thereby allowing the pulsing of the first bank active information pulse QASUM_P to be outputted as the initialization signal init in a state that the latch value of the section signal generation unit 1210 is not changed.

Then, if the delayed bank active information pulse QASUM_PD is pulsed, the output ACCEPT of the latch is changed to a logic high level to thereby enable the ring oscillator 610. Since the period end pulse RSTb maintains a logic high level during half period (T/2), the latch value is not changed at this section and thus the bank active ignore signal ACCEPTb maintains a logic low level. Accordingly, even if the bank active information pulse QASUM_P is pulsed to a logic high level during the section, the NAND gate ND12 of the logic combination unit 1220 blocks it and prevents the initialization signal init from being activated.

Meanwhile, since the period end pulse RSTb is pulsed to a logic low level after half period (T/2) and thus the latch value is changed, the logic combination unit 1220 prepares to receive the bank active information pulse QASUM_P.

As described above, the initialization signal generator in accordance with an embodiment of the present invention discharges the global data bus in the power-up mode, and again discharges the global data bus at a time point when the bank interfacing with the corresponding global data bus is activated first. Then, the initialization signal generator ignores the activation of the bank during half period (T/2) of the ring oscillator 610 and receives the active information of the bank to discharge the corresponding global data bus.

Therefore, the precharge level of the global data bus is lowered and thus the data fail phenomenon of the first high data can be prevented. Also, since no artificial level variation of the reference voltage VR occurs, a problem does not occur even during a low data transmission.

Meanwhile, the section of ignoring the bank active information pulse QASUM_P during a predetermined time is provided for reducing power that is unnecessarily consumed when the discharge of the global data bus is driven.

Figure 20:
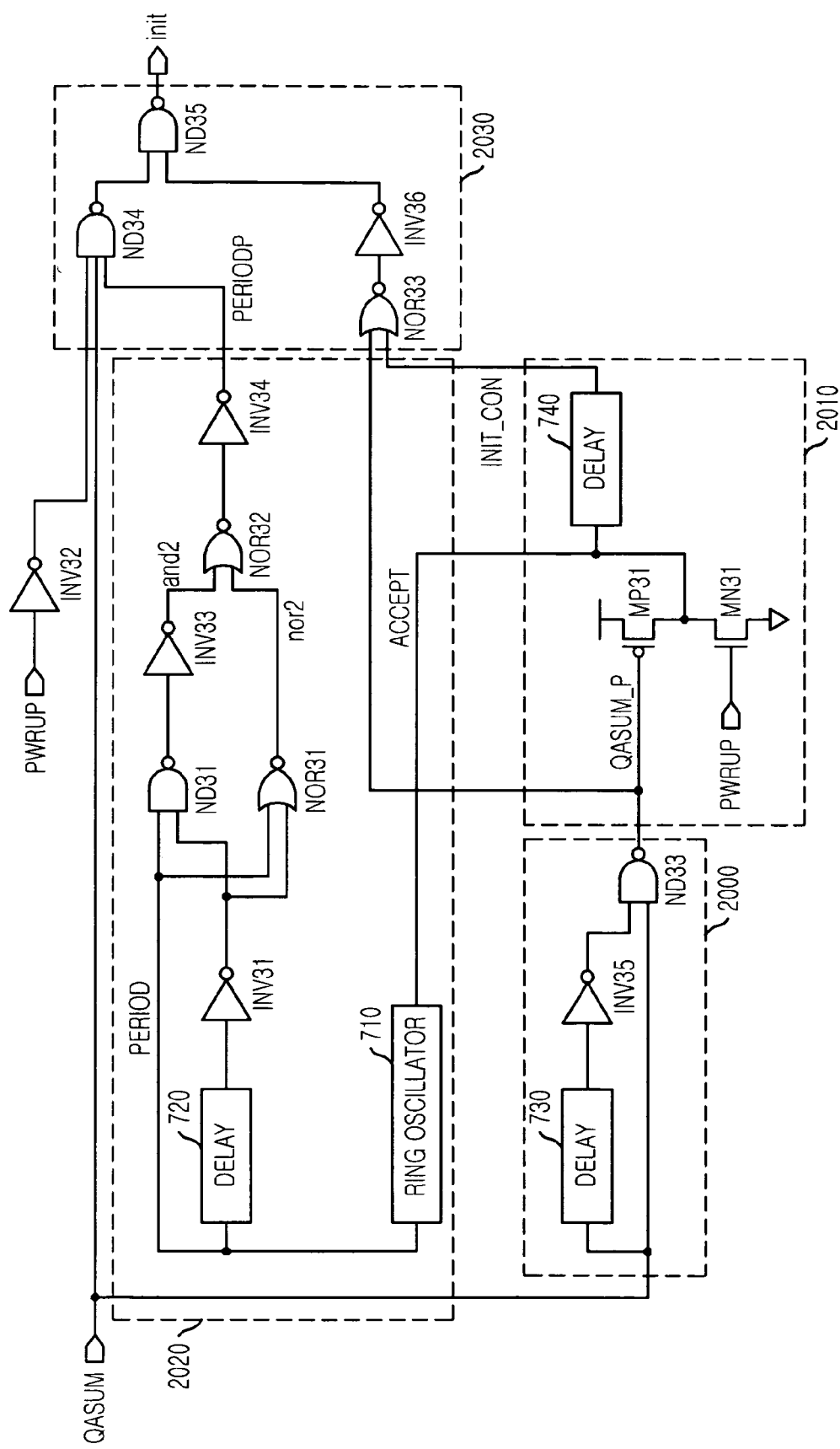
FIG. 20 is a circuit diagram of the initialization signal generator in accordance with another embodiment of the present invention.

FIG. 20 is a circuit diagram of the initialization signal generator in accordance with another embodiment of the present invention.

Referring to FIG. 20, the initialization signal generator in accordance with another embodiment of the present invention includes: a pulse generation unit 2000 for generating a bank active information pulse QASUM_P in response to a bank active information signal QASUM defining an active section of all bank which can exchange data with the corresponding global data bus; a pulse processing unit 2010 for outputting an initial control signal INIT_CON and an oscillation enable signal ACCEPT for controlling an activation of the initialization signal during an initial operation in response to the bank active information pulse QASUM_P and the power-up signal PWRUP; a period pulse generation unit 2020 for generating a period pulse PERIODP, which is activated periodically, in response to the oscillation enable signal ACCEPT; and a logic combination unit 2030 for generating the initialization signal mit in response to the bank active information signal QASUM, the bank active information pulse QASUM_P, the power-up signal PWRUP, the period pulse PERIODP, and the initial control signal.

The pulse generation unit 2000 includes: a delay circuit 730 configured to receive the bank active information signal QASUM; an inverter INV35 configured to receive an output of the delay circuit 730; and a NAND gate ND33 configured to receive an output of the inverter INV35 and the bank active information signal QASUM and generate the bank active information pulse QASUM_P.

The pulse processing unit 2010 includes: a pull-up PMOS transistor MP31 having a gate receiving the bank active information pulse QASUM_P; a pull-down NMOS transistor MN31 having a gate receiving the power-up signal PWRUP; and a delay circuit 740 configured to receive the oscillation enable signal ACCEPT, which is outputted through an output terminal of the pull-up PMOS transistor MP31 and pull-down NMOS transistor MN31.

The period pulse generation unit 2020 includes: a ring oscillator 710 for performing an oscillation in response to the oscillation enable signal ACCEPT; a delay circuit 720 configured to receive an output PERIOD of the ring oscillator 710; an inverter INV31 configured to receive an output of the delay circuit 720; a NAND gate ND31 configured to receive an output of the inverter INV31 and the output PERIOD of the ring oscillator 710; a NOR gate NOR31 configured to receive the output of the inverter INV31 and the output of the ring oscillator 710; an inverter INV33 configured to receive an output of the NAND gate ND31; a NOR gate NOR32 configured to receive an output and2 of the inverter INV32 and an output nor2 of the NOR gate NOR31; and an inverter INV34 configured to receive an output of the NOR gate NOR32 and output the period pulse PERIODP.

The logic combination unit 2030 includes: a NAND gate ND32 configured to receive the bank active information signal QASUM, the period pulse PERIODP, and an inverted power-up signal outputted from an inverter INV32; a NOR gate NOR33 configured to receive the bank active information pulse QASUM_P and the initial control signal; an inverter INV36 configured to receive an output of the NOR gate NOR33; and a NAND gate ND35 configured to receive an output of the NAND gate ND34 and an output of the inverter INV36 and output the initialization signal init.

Here, detailed descriptions about the ring oscillator 710, the delay circuits 720, 730 and 740 will be omitted.

Figure 21:
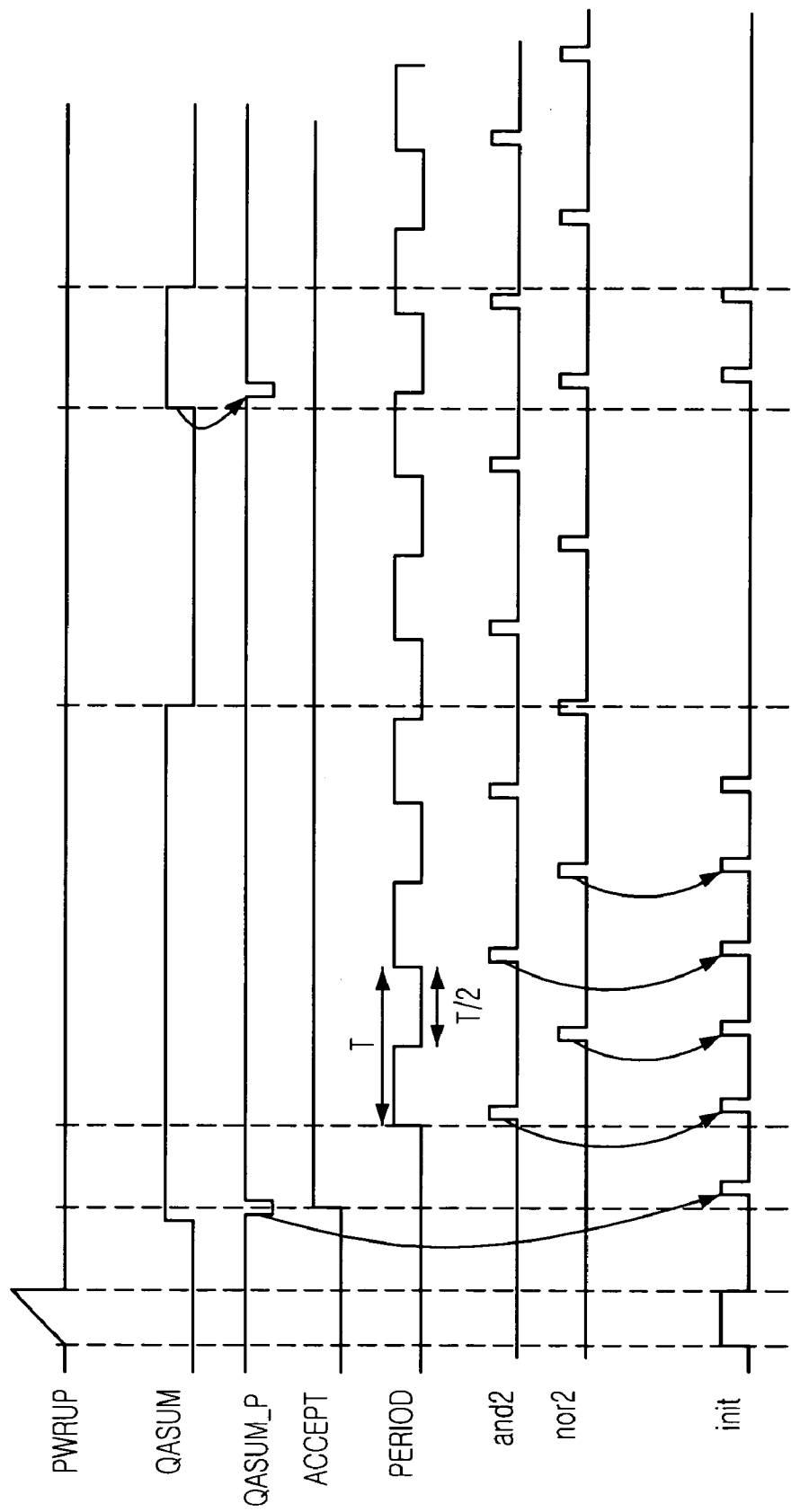
FIG. 21 is a timing diagram of the initialization signal generator shown in FIG. 20.

FIG. 21 is a timing diagram of the initialization signal generator shown in FIG. 20. An operation of the initialization signal generator in accordance with another embodiment of the present invention will be described with reference to FIG. 21.

First, if an external power is applied to a chip and thus the power-up signal PWRUP is set to a logic high level, the logic combination unit 2030 receives it to activate the initialization signal init to a logic high level.

Then, if the bank active information signal QASUM is first activated to a logic high level, the pulse generation unit 2000 receives a rising edge of the bank active information signal QASUM to pulse the bank active information pulse QASUM_P to a logic low level. The logic combination unit 2030 receives the bank active information pulse QASUM_P to allow the initialization signal init to be again activated to a logic high level.

Meanwhile, if the bank active information pulse QASUM_P is pulsed to a logic low level, the oscillation enable signal ACCEPT is activated to a logic high level. Therefore, the ring oscillator 710 is enabled to output the oscillation signal PERIOD having a period of T. If the oscillation signal PERIOD is toggled, the NAND gate ND31 and the inverter INV33 output the signal and2 which is periodically pulsed at the rising edges of the oscillation signal PERIOD. The NOR gate NOR31 outputs the signal nor2 which is periodically pulsed at the falling edges of the oscillation signal PERIOD. The NOR gate NOR32 and the inverter INV34 perform the AND operation of the signals and2 and nor2 to thereby generate the period pulse PERIODP which is pulsing to the logic high level at every half period (T/2).

The logic combination unit 2010 receives the period pulse PERIODP at the section, in which the bank active information signal QASUM is in a logic high level, and activates the initialization signal init. Meanwhile, since the NAND gate ND34 blocks the period pulse PERIODP at the section in which the bank active information signal QASUM is in a logic low level, the initialization signal is not activated. If the bank active information signal QASUM is again activated to a logic high level, the initialization signal init is again activated.

As described above, the initialization signal generator in accordance with another embodiment of the present invention discharges the global data bus in the power-up mode, and again discharges the global data bus at a time point when the bank interfacing with the corresponding global data bus is activated first. Then, the initialization signal generator enables the ring oscillator 710, so that the discharging of the corresponding global data bus is periodically performed at the section in which the bank active information signal QASUM is in an active state.

Therefore, the precharge level of the global data bus is lowered and thus the data fail phenomenon of the first high data can be prevented. Also, since no artificial level variation of the reference voltage VR occurs, a problem does not occur even during a low data transmission.

Meanwhile, since the initialization of the corresponding global data bus is not performed in a standby mode in which the bank active information signal QASUM is in an inactive state, it is possible to reduce power that is unnecessarily consumed when the discharge of the global data bus is driven.

Although the multi-port DRAM having the DRAM cells is exemplarily described, the present invention can be applied to multi-port memory devices having other RAM cells, such as SRAM.

The number of ports and banks used in the multi-port memory device can be changed depending on the capacity of the memory device and the chip size.

In accordance with the present invention, it is possible to prevent the first high data fail phenomenon at the initial operation of the multi-port memory device having the current sensing type global data bus transmission/reception structure.

The present application contains subject matter related to Korean patent applications No. 2004-32650, filed in the Korean Patent Office on May 10, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A multi-port memory device, comprising:
a global data bus having a plurality of bus lines;
a plurality of data transmission/reception blocks, each of which includes a current sensing type transmitter/receiver for exchanging data with the global data bus, the data transmission/reception block including a plurality of banks and ports;
a plurality of switching units for discharging each bus line of the global data bus in response to an initialization signal; and
an initialization signal generator for generating the initialization signal in response to a bank active information signal defining an active section of all banks, which exchanges data with a corresponding one of the global data bus,
wherein the initialization signal generator includes:
a pulse generation unit for generating a bank active information pulse in response to the bank active information signal;
a section signal generation unit for receiving the bank active information pulse and generating a bank active ignore signal for ignoring an activation of the bank active information pulse for a predetermined time after the bank active information pulse is activated; and
a logic combination unit for generating the initialization signal in response to a power-up signal, the bank active information pulse and the bank active ignore signal.

2. The multi-port memory device as recited in claim 1, wherein each of the switching units includes an NMOS transistor which is connected between the bus line and the global data bus and has a gate receiving the initialization signal.

3. The multi-port memory device as recited in claim 2, wherein the initialization signal is applied through one common line with respect to the plurality of switching units.

4. The multi-port memory device as recited in claim 1, wherein the pulse generation unit includes:

a delay circuit configured to receive the bank active information signal;
a first inverter configured to receive an output of the delay circuit;
a first NAND gate configured to receive an output of the first inverter and the bank active information signal; and
a second inverter configured to receive an output of the first NAND gate and output the bank active information pulse.

5. The multi-port memory device as recited in claim 4, wherein the section signal generation unit includes:
a second delay circuit configured to receive the bank active information pulse;
a third inverter configured to receive an output of the second delay circuit;
a fourth inverter configured to receive an output of the third inverter and output a delayed bank active information pulse;
a buffer configured with a pull-down NMOS transistor having a gate receiving the delayed bank active information pulse, a pull-down NMOS transistor and a pull-up PMOS transistor, each of which has a gate receiving a period end pulse;
a PMOS transistor for initializing an output terminal of the buffer, the PMOS transistor being connected between the output terminal of the buffer and a power supply voltage terminal and having a gate receiving an inverted power-up signal;
an inverter latch for latching an output of the buffer;
a fifth inverter configured to receive an output of the inverter latch and output the bank active ignore signal;
a ring oscillator configured to receive the output of the inverter latch; and
a sixth inverter configured to receive an output of the ring oscillator and generate the period end pulse.

6. The multi-port memory device as recited in claim 5, wherein the logic combination unit includes:
a second NAND gate configured to receive the bank active information pulse and the bank active ignore signal;
a seventh inverter configured to receive an output of the second NAND gate;
a NOR gate configured to receive the power-up signal and an output of the seventh inverter; and
an eighth inverter configured to receive an output of the NOR gate and output the initialization signal.

7. A multi-port memory device, comprising:
a global data bus having a plurality of bus lines;
a plurality of data transmission/reception blocks, each of which includes a current sensing type transmitter/receiver for exchanging data with the global data bus, the data transmission/reception block including a plurality of banks and ports;
a plurality of switching units for discharging each bus line of the global data bus in response to an initialization signal; and
an initialization signal generator for generating the initialization signal in response to a bank active information signal defining an active section of all banks, which exchanges data with a corresponding one of the global data bus,
wherein the initialization signal generator includes:
a pulse generation unit for generating a bank active information pulse in response to the bank active information signal;

a pulse processing unit for outputting an initial control signal and an oscillation enable signal for controlling an activation of the initialization signal during an initial operation in response to the bank active information pulse and a power-up signal;

a period pulse generation unit for generating a period pulse, which is activated periodically, in response to the oscillation enable signal; and a logic combination unit for generating the initialization signal in response to the bank active information signal, the bank active information pulse, the power-up signal, the period pulse, and the initial control signal.

8. The multi-port memory device as recited in claim 7, wherein the pulse generation unit includes:

a first delay circuit configured to receive the bank active information signal;

a first inverter configured to receive an output of the first delay circuit; and a first NAND gate configured to receive an output of the first inverter and the bank active information signal and generate the bank active information pulse.

9. The multi-port memory device as recited in claim 8, wherein the pulse processing unit includes:

a pull-up PMOS transistor having a gate receiving the bank active information pulse;

a pull-down NMOS transistor having a gate receiving the power-up signal; and a delay circuit configured to receive the oscillation enable signal, which is outputted through an output terminal of the pull-up PMOS transistor and pull-down NMOS transistor.

10. The multi-port memory device as recited in claim 9, wherein the period pulse generation unit includes:

a ring oscillator for performing an oscillation in response to the oscillation enable signal;

a third delay circuit configured to receive an output of the ring oscillator;

a second inverter configured to receive an output of the third delay circuit;

a second NAND gate configured to receive an output of the second inverter and the output of the ring oscillator;

a first NOR gate configured to receive the output of the second inverter and the output of the ring oscillator;

a third inverter configured to receive an output of the second NAND gate;

a second NOR gate configured to receive an output of the third inverter and an output of the first NOR gate; and a fourth inverter configured to receive an output of the second NOR gate and output the period pulse.

11. The multi-port memory device as recited in claim 10, wherein the logic combination unit includes:

a third NAND gate configured to receive the bank active information signal, the period pulse, and an inverted power-up signal;

a third NOR gate configured to receive the bank active information pulse and the initial control signal;

a fifth inverter configured to receive an output of the third NOR gate; and a fourth NAND gate configured to receive an output of the third NAND gate and an output of the fifth inverter and output the initialization signal.

* * * * *